United States Patent
Onda et al.

(10) Patent No.: US 12,463,526 B2
(45) Date of Patent: Nov. 4, 2025

(54) GATE LEAKAGE CURRENT DETECTION DETERMINING GATE WITHSTAND VOLTAGE RATING AND A POWER CONVERTER

(71) Applicant: Mitsubishi Electric Corporation, Tokyo (JP)

(72) Inventors: Kohei Onda, Tokyo (JP); Shotaro Karasuyama, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 198 days.

(21) Appl. No.: 18/035,290

(22) PCT Filed: Dec. 28, 2020

(86) PCT No.: PCT/JP2020/049155
§ 371 (c)(1),
(2) Date: May 4, 2023

(87) PCT Pub. No.: WO2022/144986
PCT Pub. Date: Jul. 7, 2022

(65) Prior Publication Data
US 2024/0006978 A1    Jan. 4, 2024

(51) Int. Cl.
*H02M 1/08*    (2006.01)
*H02M 1/32*    (2007.01)

(52) U.S. Cl.
CPC ............ *H02M 1/08* (2013.01); *H02M 1/32* (2013.01)

(58) Field of Classification Search
CPC .............................................. H02M 1/08–088
See application file for complete search history.

(56) References Cited

U.S. PATENT DOCUMENTS

2017/0040992 A1*  2/2017  Nakano ................. H03K 17/20

FOREIGN PATENT DOCUMENTS

| EP | 3 035 532 A1 | 6/2016 |
|----|--------------|--------|
| JP | 2003-070231 A | 3/2003 |
| JP | 2003-143833 A | 5/2003 |
| JP | 2008-147923 A | 6/2008 |

OTHER PUBLICATIONS

International Search Report and Written Opinion mailed on Mar. 16, 2021, received for PCT Application PCT/JP2020/049155, filed on Dec. 28, 2020, 9 pages including English Translation.
Erturk et al., "Real-Time Ageing Detection of SiC MOSFETs", IEEE, 2017-APEC-2186, pp. 1-9.
Action issued Jan. 20, 2025 in Indian Patent Application No. 202327032772, 6 pages.

* cited by examiner

*Primary Examiner* — Peter M Novak
(74) *Attorney, Agent, or Firm* — XSENSUS LLP

(57) ABSTRACT

A semiconductor driving device includes: a control unit which generates an ON/OFF command for a semiconductor switching element; a gate power supply unit which generates voltage to be applied between a gate terminal and a source terminal of the semiconductor switching element; a gate driving unit which applies the voltage generated by the gate power supply unit, between the gate terminal and the source terminal; and a gate leakage current detection unit which detects gate leakage current of the semiconductor switching element on the basis of voltage occurring at a gate resistor connected to the gate terminal, using a negative-side potential of the gate power supply unit as a reference.

16 Claims, 17 Drawing Sheets

GATE LEAKAGE CURRENT DETECTION DETERMINING GATE WITHSTAND VOLTAGE RATING AND A POWER CONVERTER

CROSS-REFERENCE TO RELATED APPLICATION

The present application is based on PCT filing PCT/JP2020/049155, filed Dec. 28, 2020, the entire contents of which are incorporated herein by reference.

TECHNICAL FIELD

The present disclosure relates to a semiconductor driving device and a power conversion device using the same.

BACKGROUND ART

In a power conversion device such as an inverter device including a power conversion unit and a control unit for controlling the power conversion unit, power conversion is performed through ON/OFF operations of semiconductor switching elements. As the semiconductor switching elements, for example, a semiconductor switching element of a voltage driven type such as a metal-oxide-semiconductor field-effect transistor (MOSFET) or an insulated-gate-bipolar-transistor (IGBT) is used.

Such semiconductor switching elements are applied to various power conversion devices for consumer use, industrial use, and vehicular use, and in order to control the semiconductor switching elements, a semiconductor driving device is needed.

In general, a driving device for a semiconductor switching element of a voltage driven type has a function of controlling the conduction state of a semiconductor switching element by applying voltage to the gate of the semiconductor switching element. In recent years, in accordance with requirements for size reduction, efficiency improvement, and reliability improvement of the power conversion device, technology for providing a semiconductor driving device having a high function, and a semiconductor driving device capable of favorably driving a wide bandgap semiconductor switching element such as SiC or GaN, have been disclosed.

For a semiconductor switching element having a MOS gate structure such as a MOSFET or IGBT, reliability of a gate oxide film is important, in particular, in a high-withstand-voltage product which needs to keep high voltage.

In general, applying a wide bandgap semiconductor enables high-temperature operation, but this leads to a severe condition for reliability of the gate oxide film. Besides, for example, in a case of a SiC device, the gate oxide film electric field is greater than in a Si device because of the relation of permittivity, and carbon contained in SiC reduces reliability of the gate oxide film, which might influence the device life. For example, according to an experiment result in Non-Patent Document 1, it is reported that, through repetition of power cycles of a SiC-MOSFET, the gate oxide film directly under wire bonding is subjected to a high-temperature condition, so that gate leakage current increases.

When a semiconductor switching element has failed, the system might be stopped, thus resulting in significant temporal and economic losses. In this regard, in recent years, technology for finding a sign leading to failure of a semiconductor switching element has been under development.

A method for diagnosing deterioration in the gate withstand voltage from a gate leakage current value indirectly calculated on the basis of the magnitude of the gate-emitter voltage is disclosed (for example, Patent Document 1), and a method for diagnosing deterioration in the gate withstand voltage from the integral value of gate current during switching is disclosed (for example, Patent Document 2). Further, a method for diagnosing deterioration in the gate withstand voltage from a gate leakage current value calculated on the basis of the voltage across a gate resistor is disclosed (for example, Non-Patent Document 1).

CITATION LIST

Patent Document

Patent Document 1: Japanese Laid-Open Patent Publication No. 2003-70231
Patent Document 2: Japanese Laid-Open Patent Publication No. 2003-143833

Non-Patent Document

Non-Patent Document 1: F. Erturk, E. Ugur, J. Olson and B. Akin, "Real-Time Aging Detection of SiC MOSFETs" in IEEE Trans. Ind. Appl., vol. 55, no. 1, pp. 600-609, 2019

SUMMARY OF THE INVENTION

Problems to be Solved by the Invention

However, difference between accuracy required for diagnosing a sign of deterioration in the gate withstand voltage before failure and detection accuracy of a circuit provided on the semiconductor driving device becomes a problem in application.

In particular, in a SiC device having a problem in reliability of the gate oxide film, for example, detection accuracy of several ten µA is required, but a simple circuit on the semiconductor driving device can only achieve several mA to several ten mA.

The present disclosure has been made to solve the above problem, and an object of the present disclosure is to detect slight gate leakage current occurring at a semiconductor level, with high accuracy, and achieve deterioration diagnosis before failure of a semiconductor switching element to be driven.

Solution to the Problems

A semiconductor driving device according to the present disclosure is a semiconductor driving device for performing ON/OFF control of a semiconductor switching element by applying gate voltage, the semiconductor driving device including a control unit which generates an ON/OFF command for the semiconductor switching element; a gate power supply unit which generates voltage to be applied between a gate terminal of the semiconductor switching element and a reference terminal serving as a reference for the gate voltage; a gate driving unit which applies the voltage generated by the gate power supply unit, between the gate terminal and the reference terminal; and a leakage current detection unit which detects gate leakage current of the semiconductor switching element on the basis of voltage occurring between both terminals of a gate resistor which limits current for charging a gate of the semiconductor switching element, using a negative-side potential or a positive-side potential of the gate power supply unit as a reference.

A power conversion device according to the present disclosure includes the above semiconductor driving device; and a power conversion unit composed of main semiconductor switching elements of an upper arm and a lower arm connected in series, for converting inputted power and outputting the converted power.

Effect of the Invention

The semiconductor driving device according to the present disclosure makes it possible to provide a semiconductor driving device that can detect slight gate leakage current with high accuracy and achieve deterioration diagnosis before failure of a semiconductor switching element to be driven.

The power conversion device according to the present disclosure makes it possible to provide a power conversion device that can detect slight gate leakage current with high accuracy and achieve deterioration diagnosis before failure of a semiconductor switching element to be driven.

DESCRIPTION OF EMBODIMENTS

Embodiment 1

Figure 1:
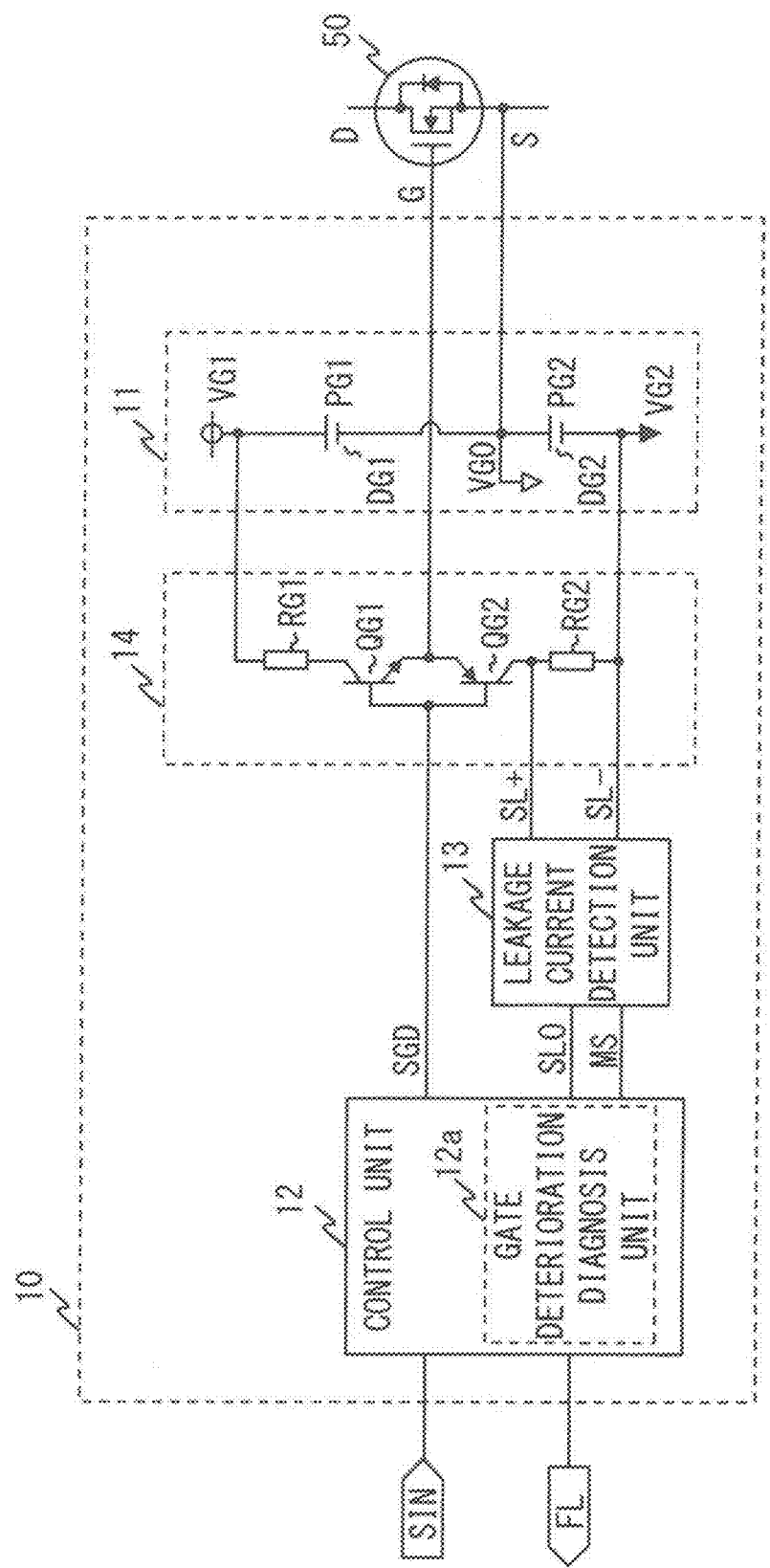
FIG. 1 is a block diagram showing the configuration of a semiconductor driving device according to embodiment 1.

Embodiment 1 relates to a semiconductor driving device including a control unit which generates an ON/OFF command for a semiconductor switching element, a gate power supply unit which generates voltage to be applied between a gate terminal and a source terminal of the semiconductor switching element, a gate driving unit which applies the voltage between the gate terminal and the source terminal, and a leakage current detection unit which detects gate leakage current of the semiconductor switching element on the basis of voltage occurring at a gate resistor which limits current for charging a gate of the semiconductor switching element, using a negative-side potential or a positive-side potential of the gate power supply unit as a reference.

Hereinafter, the configuration and operation of the semiconductor driving device according to embodiment 1 will be described with reference to FIG. 1 which is a block diagram showing the configuration of the semiconductor driving device, FIG. 2 which is a block diagram showing the configuration of the gate leakage current detection unit of the semiconductor driving device, FIG. 3 and FIG. 4 which are block diagrams showing other configurations of the semiconductor driving device, FIG. 5 which illustrates a time chart of each signal in the semiconductor driving device, FIG. 6 and FIG. 7 which illustrate other time charts of each signal in the semiconductor driving device, and FIG. 8 which is a block diagram showing another configuration of the semiconductor driving device.

The entire configuration of the semiconductor driving device of embodiment 1 will be described with reference to FIG. 1.

The semiconductor driving device 10 performs ON/OFF control of a semiconductor switching element 50, and includes a gate power supply unit 11, a control unit 12, a gate leakage current detection unit 13, and a gate driving unit 14. In FIG. 1, the gate leakage current detection unit is shown as leakage current detection unit. The same applies to the subsequent drawings (e.g., FIG. 4).

The gate power supply unit 11 generates voltage to be applied between a gate terminal G and a source terminal S which is a reference terminal, of the semiconductor switching element 50.

The gate driving unit 14 applies the voltage generated by the gate power supply unit, between the gate terminal G and the source terminal which is the reference terminal, of the semiconductor switching element 50.

The semiconductor driving device 10 performs ON/OFF control of the semiconductor switching element 50 by applying gate voltage Vgs between the gate terminal G and the source terminal S which is the reference terminal, of the semiconductor switching element 50. Main terminals (drain terminal D and source terminal S) of the semiconductor switching element 50 are connected to a main circuit (not shown) of a device in which the semiconductor switching element 50 is used.

The semiconductor switching element 50 is not a part of the semiconductor driving device 10, but is closely related thereto, and therefore is described without being separated from the semiconductor driving device 10.

Next, the configurations and functions of parts of the semiconductor driving device 10 will be described. The gate power supply unit 11 includes a DC power supply DG1 and a DC power supply DG2, and the DC power supply DG1 and the DC power supply DG2 are connected in series as shown in FIG. 1.

Voltage of the DC power supply DG1 is referred to as positive power supply voltage PG1, and voltage of the DC power supply DG2 is referred to as negative power supply voltage PG2.

The potential of a positive-side terminal of the DC power supply DG1 is referred to as positive-side potential VG1, and the potential of a negative-side terminal of the DC power supply DG2 is referred to as a negative-side potential VG2. A connection point between the negative side of the DC power supply DG1 and the positive side of the DC power supply DG2 is connected to the source terminal S of the semiconductor switching element 50, and the potential thereof is referred to as reference potential VG0.

In the following description, for example, the wording " . . . connected to the positive-side terminal of the DC power supply DG1 whose potential is the positive-side potential VG1" may be described as " . . . connected to the positive-side potential VG1", as appropriate, for simplification purpose. The same applies to the negative-side potential VG2 and the reference potential VG0.

The gate power supply unit 11 generates the positive power supply voltage PG1 and the negative power supply voltage PG2 relative to the reference potential VG0. However, the gate power supply unit 11 may be configured to be able to output a multilevel waveform as the gate voltage Vgs, with increased kinds of positive power supply voltages or negative power supply voltages. Alternatively, the DC power supply DG2 which is a negative power supply may be omitted as necessary. Description for such a case will be given in description for FIG. 8.

The control unit 12 generates an ON/OFF command, that is, a gate driving command SGD, for the semiconductor switching element 50.

Specifically, the control unit 12 receives an ON/OFF command signal SIN transmitted from a high-order external control device (not shown), and performs signal processing in the control unit 12, to generate the gate driving command SGD. The signal processing at this time is already known and therefore the description thereof is omitted.

In general, signal transmission and reception are performed via an optical semiconductor element (photocoupler), a magnetic coupling element (pulse transformer), and the like, but the optical semiconductor element is not shown in FIG. 1.

The gate driving command SGD generated in the control unit 12 is amplified by the gate driving unit 14 using the positive power supply voltage PG1 and the negative power supply voltage PG2 generated by the gate power supply unit 11, and then the amplified voltage is outputted as the gate voltage Vgs from the semiconductor driving device 10 to the semiconductor switching element 50.

The control unit 12 includes a gate deterioration diagnosis unit 12a therein. The function of the gate deterioration diagnosis unit 12a will be described later.

The gate leakage current detection unit 13 detects gate leakage current of the semiconductor switching element 50 to be driven, using voltage occurring at an OFF gate resistor RG2 in the gate driving unit 14 described later.

A specific configuration example of the gate leakage current detection unit 13 will be described with reference to FIG. 2. The gate leakage current detection unit 13 receives a determination mask signal MS from the control unit 12, and outputs a gate leakage current detection signal SLO to the control unit 12.

The gate driving unit 14 includes a transistor QG1 formed by an NPN bipolar transistor, a transistor QG2 formed by a PNP bipolar transistor, an ON gate resistor RG1, and an OFF gate resistor RG2. Here, the OFF gate resistor RG2 is a gate resistor which limits current for charging the gate of the semiconductor switching element 50.

A connection point between the emitter of the transistor QG1 and the emitter of the transistor QG2 is connected to the gate terminal G of the semiconductor switching element 50. A connection point between the base of the transistor QG1 and the base of the transistor QG2 is connected to an output terminal for the gate driving command SGD of the control unit 12.

The collector of the transistor QG1 is connected to the positive-side potential VG1 via the ON gate resistor RG1. The collector of the transistor QG2 is connected to the negative-side potential VG2 via the OFF gate resistor RG2.

Here, the entire function and operation of the gate leakage current detection unit 13 will be described.

The gate leakage current detection unit 13 detects gate leakage current on the basis of voltage occurring at the OFF gate resistor RG2, using the negative-side potential VG2 of the gate power supply unit 11 as a reference. The example shown in FIG. 1 has a configuration in which voltage across the OFF gate resistor RG2 which is an emitter resistor of the transistor QG2 is detected.

In FIG. 1, input terminals of the gate leakage current detection unit 13 are denoted by SL+ and SL−. The input terminal SL+ is connected to a connection point between the collector of the transistor QG2 and the OFF gate resistor RG2. The input terminal SL− is connected to the OFF gate resistor RG2 and the negative-side potential VG2.

Therefore, in a case where there is no abnormality in the gate withstand voltage of the semiconductor switching element 50, when the ON/OFF command signal SIN is OFF, the potential of the gate terminal G of the semiconductor switching element 50 is equal to the negative-side potential VG2 of the gate power supply unit 11, so that leakage current is not detected.

On the other hand, in a case where the gate withstand voltage of the semiconductor switching element 50 is deteriorated, when the ON/OFF command signal SIN is OFF, voltage according to gate leakage current of the semiconductor switching element 50 and the known gate resistor value of the OFF gate resistor RG2 occurs across the OFF gate resistor RG2, whereby the gate leakage current can be detected.

When the gate leakage current detection unit 13 has detected the gate leakage current, the gate leakage current detection unit 13 outputs the gate leakage current detection signal SLO to the control unit 12.

As described in the time chart shown in FIG. 6 later, the determination mask signal MS for disabling the function of the gate leakage current detection unit 13 is outputted from the control unit 12 to the gate leakage current detection unit 13.

The gate leakage current detection signal SLO outputted from the gate leakage current detection unit 13 is diagnosed by the gate deterioration diagnosis unit 12a in the control unit 12.

For example, a case where greater gate leakage current as compared to a reference value set in advance from the characteristics of the semiconductor switching element 50 has occurred, may be determined to be abnormal, or a case where the increase amount of gate leakage current from the value before start of usage of the semiconductor switching element 50 as a reference has exceeded a reference increase amount, may be determined to be abnormal.

Here, setting examples of a determination reference value which is a deterioration determination level Vthf described in FIG. 5 to FIG. 7 later will be described.

(1) The determination reference value is set to a greater value than a screening reference value for gate leakage current at the time of shipping inspection of the semiconductor switching element.

(2) The determination reference value is set to a greater value than a result obtained by dividing an input offset voltage value of the gate leakage current detection circuit by a resistance value of the gate resistor used for diagnosis. In an operational amplifier OP1 in FIG. 2, a specification value of input offset voltage may be used.

The above (1) is a condition for preventing erroneous detection due to variation in gate leakage current of a normal product of the semiconductor switching element, and the above (2) is a condition for a value greater than the theoretical detection limit of the gate leakage current detection circuit. The reference value may be set considering, for example, a double margin with respect to a milder one of (1) and (2).

When deterioration in the gate withstand voltage is diagnosed by the gate deterioration diagnosis unit 12a, a deterioration determination signal DJS is generated, and the control unit 12 transmits a fail signal FL to the high-order external control device. Although not shown, the control unit 12 records a diagnosis result in an internal memory and/or performs display thereof as a warning, thereby allowing replacement at an appropriate timing before the semiconductor switching element 50 leads to breakage.

Here, a specific configuration example of the gate leakage current detection unit 13 will be described with reference to FIG. 2.

The gate leakage current detection unit 13 includes the operational amplifier OP1, a comparator CP1, input resistors R1, R2 for the operational amplifier OP1, clamp diodes D1, D2 for inputs of the operational amplifier OP1, a feedback resistor R3 for the operational amplifier OP1, an AND circuit AD1, an inversion circuit IV1, and a resistor P4 and a capacitor C1 forming a low-pass filter for an output of the AND circuit AD1.

In this configuration example, voltage between the input terminals SL+ and SL− is amplified by the operational amplifier OP1, and the amplified voltage is compared with a reference value Vref by the comparator CP1, thereby performing determination for gate leakage current on a voltage-equivalent basis.

If the reference value Vref is increased, occurrence of the gate leakage current detection signal SLO is suppressed, and if the reference value Vref is decreased, the possibility of erroneous diagnosis of gate withstand voltage deterioration of the semiconductor switching element 50 increases. Therefore, the reference value Vref needs to be considered in advance and set to an appropriate value.

An output of the comparator CP1 is inputted to an input terminal of the AND circuit AD1. An output of the AND circuit AD1 is subjected to the low-pass filter (resistor R4, capacitor C1) and then is outputted as the gate leakage current detection signal SLO to the control unit 12.

The determination mask signal MS from the control unit 12 is inputted through the inversion circuit IV1 to another input terminal of the AND circuit AD1.

Thus, when the determination mask signal MS is Hi, an output of the comparator CP1 is blocked. When the determination mask signal MS is Lo, an output of the comparator CP1 is outputted as it is from the AND circuit AD1.

Since the purpose is to detect steady leakage current of the semiconductor switching element 50, the low-pass filter is provided at the output of the AND circuit AD1. Thus, the influence of fluctuation of gate current occurring in switching of the semiconductor switching element 50 is eliminated, whereby erroneous operation due to noise can be prevented.

A digital filter may be provided instead of the low-pass filter formed by the resistor R4 and the capacitor C1.

The clamp diodes D1, D2 provided on the input side of the operational amplifier OP1 are for preventing the operational amplifier OP1 from being saturated with great input voltage.

In the semiconductor driving device 10 of embodiment 1, the potential of the input terminal SL− used as a reference for determination by the gate leakage current detection unit 13 is the negative-side potential VG2 of the negative-side terminal of the DC power supply DG2 of the gate power supply unit 11. Thus, the semiconductor driving device 10 employs a so-called low-side detection type, whereby an operational amplifier having small input offset voltage can be used, and therefore high detection accuracy can be achieved.

On the other hand, in a case of detecting leakage current using, as a reference, a potential that varies along with switching of the semiconductor switching element 50, it is necessary to select an operational amplifier of a so-called high-side detection type. Therefore, the input offset becomes great, and a component having a high common-mode input voltage range needs to be used, so that detection accuracy is reduced.

The semiconductor driving device 10 of the present disclosure has been made by considering that it is not necessary to detect gate leakage current at all timings in order to diagnose a sign of deterioration in the gate withstand voltage of the semiconductor switching element 50. Therefore, the detection timing for gate leakage current can be limited to a period in which the gate terminal G is fixed at either the negative-side potential VG2 or the positive-side potential VG1. Thus, the semiconductor driving device 10 can achieve high detection accuracy.

FIG. 1 for the semiconductor driving device 10 according to embodiment 1 shows an example in which gate leakage current is detected using the negative-side potential VG2 as a reference in a period in which the gate terminal G of the semiconductor switching element 50 is fixed at the negative-side potential VG2.

Figure 2:
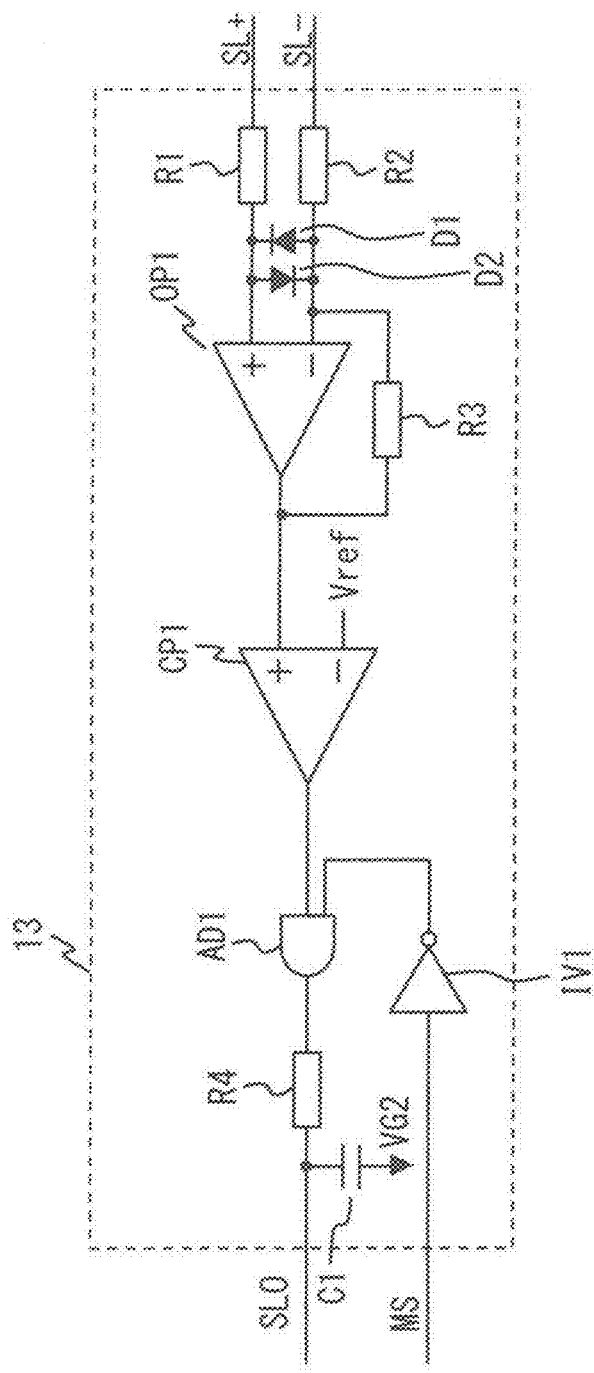
FIG. 2 is a block diagram showing the configuration of a gate leakage current detection unit of the semiconductor driving device according to embodiment 1.

In the configuration of the gate leakage current detection unit 13 in FIG. 2, the example in which the operational amplifier OP1 and the comparator CP1 are used has been shown. However, the present disclosure is not limited thereto, and is generally applicable to such configurations that gate leakage current is detected on the basis of voltage occurring at the OFF gate resistor RG2 using the negative-side potential VG2 as a reference. For example, a current sense amplifier IC having high accuracy may be used instead of using discrete components such as the operational amplifier OP1 and the comparator CP1.

Next, other configuration examples of the semiconductor driving device 10 will be described with reference to FIG. 3 and FIG. 4.

In the example of the gate driving unit 14 shown in FIG. 1, the OFF gate resistor RG2 is provided as a collector load resistor for the PNP transistor. However, the present disclosure is not limited thereto, and is applicable to gate driving units having various configurations.

Figure 3:
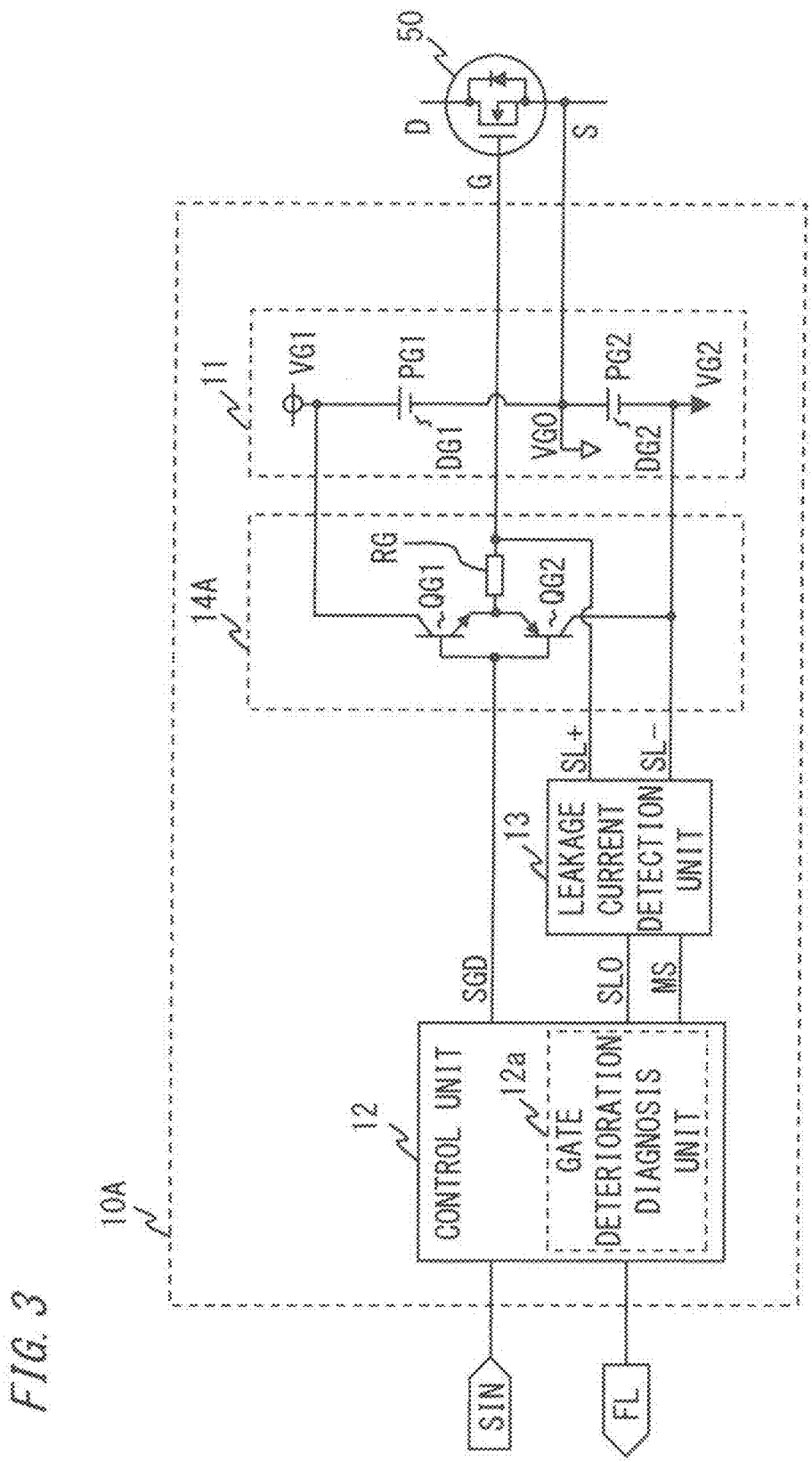
FIG. 3 is a block diagram showing another configuration of the semiconductor driving device according to embodiment 1.

For example, as shown in FIG. 3, the present disclosure is applicable also to a configuration in which a gate resistor RG is provided on the output side of the gate driving unit 14. In FIG. 3, the semiconductor driving device and the gate driving unit are respectively denoted by 10A and 14A, for discrimination from the semiconductor driving device 10 and the gate driving unit 14 in FIG. 1.

Also in this case, the gate leakage current detection unit 13 can detect gate leakage current in a period in which the gate terminal G is fixed at the negative-side potential VG2, on the basis of voltage occurring at the gate resistor RG using the negative-side potential VG2 as a reference. In this period, an ON resistance value converted from the ON voltage of the transistor QG2 is so small as to be negligible as compared to the gate resistor RG, and therefore there is no influence on detection accuracy.

In the example of the gate driving unit 14A shown in FIG. 3, the gate resistor RG serves as both of an ON gate resistor and an OFF gate resistor. However, an ON gate resistor and an OFF gate resistor may be provided individually. For example, connection of the emitter of the transistor QG1 and the emitter of the transistor QG2 may be separated, and an ON gate resistor and an OFF gate resistor may be individually provided as emitter resistors.

Alternatively, an ON gate resistor and an OFF gate resistor for which rectification directions are limited to directions opposite to each other by diodes may be connected in parallel.

Figure 4:
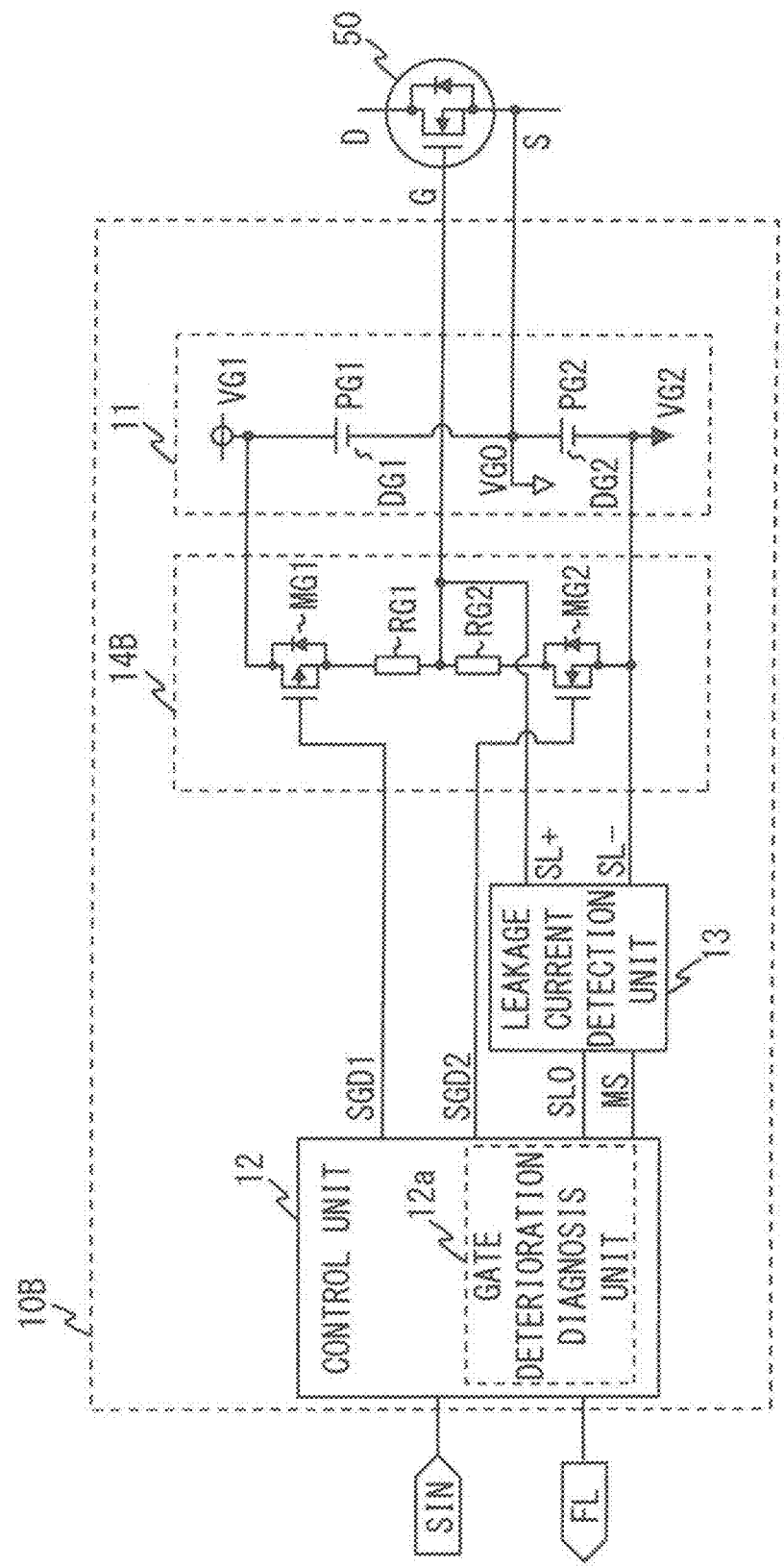
FIG. 4 is a block diagram showing another configuration of the semiconductor driving device according to embodiment 1.

FIG. 4 shows another configuration example of the gate driving unit 14. In FIG. 4, the semiconductor driving device and the gate driving unit are respectively denoted by 10B and 14B, for discrimination from the semiconductor driving device 10 and the gate driving unit 14 in FIG. 1.

In this configuration, the gate driving unit 14B is formed by MOSFETs, instead of bipolar transistors. In this case, a transistor MG1 which is an N-MOSFET on the positive side and a transistor MG2 which is a P-MOSFET on the negative side need to be prevented from becoming ON at the same time. Therefore, the gate driving command SGD is separated into a gate driving command SGD1 and a gate driving command SGD2, thereby providing a period in which the transistor MG1 and the transistor MG2 become OFF at the same time (so-called dead time). Also in this case, the semiconductor driving device 10B can diagnose gate leakage current with high accuracy on the basis of voltage occurring at the OFF gate resistor RG2 using the negative-side potential VG2 as a reference.

Hereinafter, operation patterns of the semiconductor driving device 10 of embodiment 1 will be described with reference to time charts of signals shown in FIG. 5, FIG. 6, and FIG. 7. Here, description will be given using the semiconductor driving device 10 as a representative, but the same applies to the semiconductor driving device 10A and the semiconductor driving device 10B.

First, with reference to the time chart shown in FIG. 5, an example of a detection timing for leakage current will be described. In the example shown in FIG. 5, the semiconductor driving device 10 diagnoses gate leakage current in an OFF period while the semiconductor switching element 50 undergoes ON/OFF operation. That is, the ON/OFF command signal SIN transmitted from the high-order external control device alternates between a Lo level and a Hi level, and accordingly, the gate voltage Vgs changes into the positive-side potential VG1 which is an ON level and the negative-side potential VG2 which is an OFF level. In the gate OFF period during switching operation of the semiconductor switching element 50, the gate leakage current detection unit 13 detects gate leakage current on the basis of voltage occurring at the OFF gate resistor RG2 using the negative-side potential VG2 as a reference.

The gate leakage current detection signal SLO of the gate leakage current detection unit 13 changes due to detection of gate current when the semiconductor switching element 50 is turned off, but since the low-pass filter is provided at the output of the AND circuit AD1, the gate current disappears and the signal level returns to a Lo level before reaching the deterioration determination level Vthf.

On the other hand, gate leakage current when the gate is deteriorated is a low-frequency component occurring steadily, and therefore passes through the low-pass filter and is outputted as a Hi-level signal. In the example shown in FIG. 5, the gate leakage current detection signal SLO determined by gate leakage current reaches the deterioration determination level Vthf at time t1.

When the gate leakage current detection signal SLO has exceeded the deterioration determination level Vthf, the gate deterioration diagnosis unit 12a in the control unit 12 generates a deterioration determination signal DJS, and the control unit 12 records generation of the deterioration determination signal DJS in the internal memory and/or performs display thereof as a warning.

From the deterioration determination signal DJS generated by the gate deterioration diagnosis unit 12a, the control unit 12 generates a fail signal FL for keeping the above signal and transmits the fail signal FL to the external control device. In addition, the control unit 12 can change operation of the semiconductor switching element 50 by changing the ON/OFF command signal SIN or the gate driving command SGD.

As a change example of operation of the semiconductor switching element 50, switching operation of the semiconductor switching element 50 can be stopped, the cycle of the switching operation can be reduced, the modulation method or the modulation factor of the switching operation can be changed, or load current of the semiconductor driving device can be reduced. In addition, the level of the gate voltage Vgs of the semiconductor switching element 50 can be changed. In any case, the purpose is to reduce the junction temperature of the semiconductor switching element 50 or reduce the applied gate voltage, thereby suppressing progress of deterioration of the gate oxide film and prolonging the remaining life. This allows replacement at an appropriate timing before the semiconductor switching element 50 is broken.

Next, with reference to the time chart shown in FIG. 6, another example of a detection timing for the gate leakage current will be described. In this example, a timing at which the semiconductor driving device 10 shifts to an OFF keeping state from a state of performing ON/OFF operation of the semiconductor switching element 50, is shown.

Figure 6:
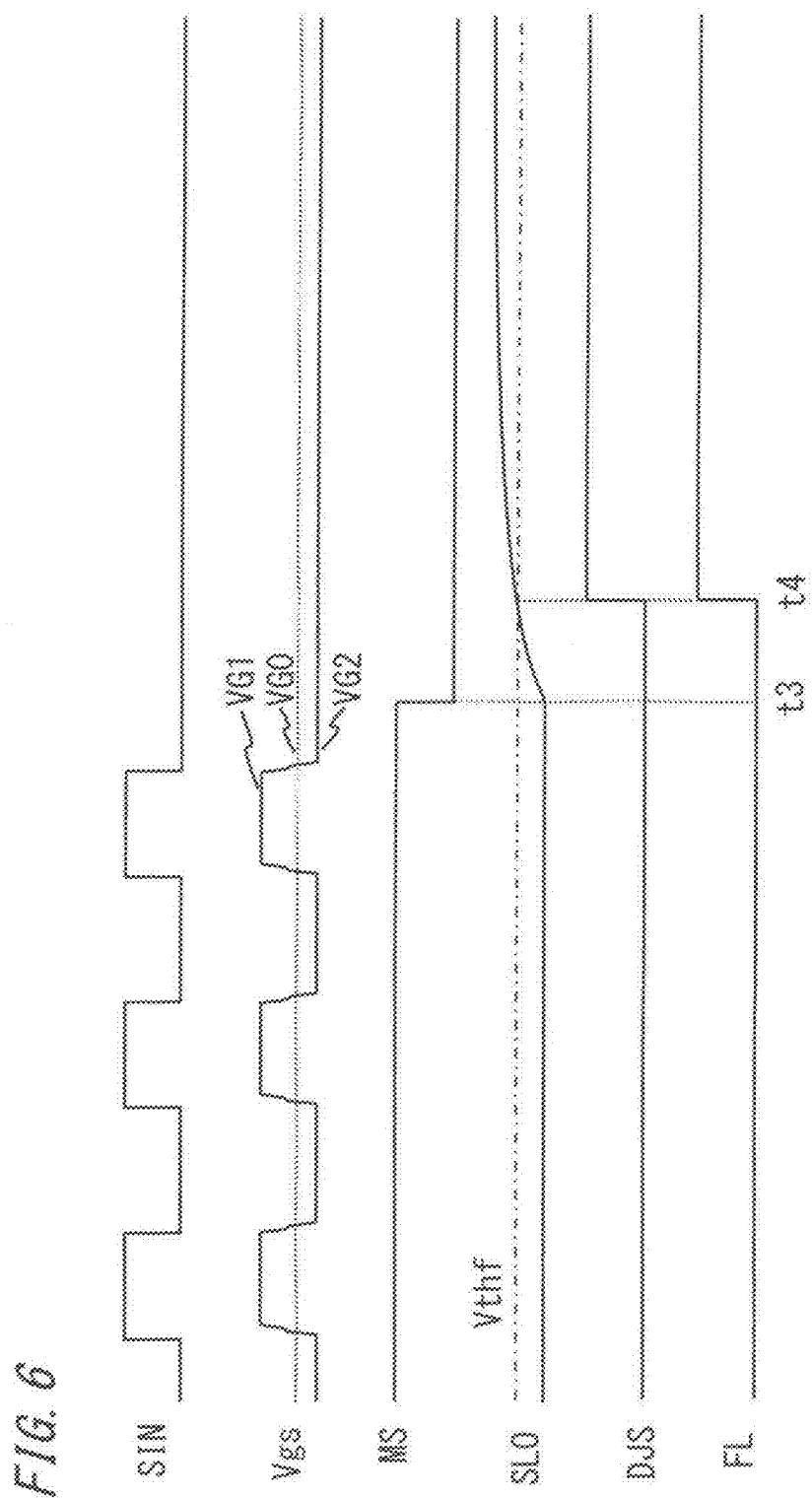
FIG. 6 illustrates another time chart of each signal in the semiconductor driving device according to embodiment 1.
Figure 7:
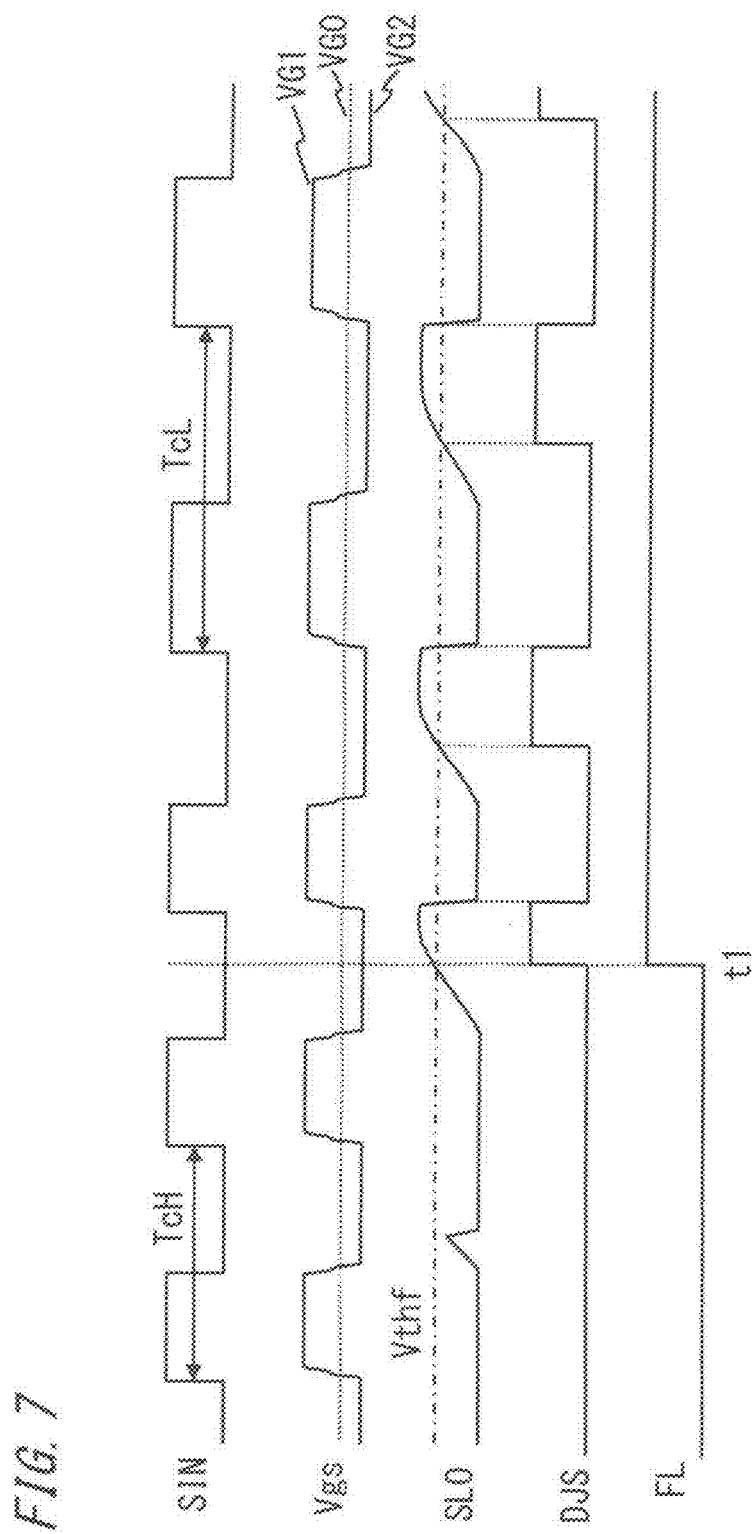
FIG. 7 illustrates another time chart of each signal in the semiconductor driving device according to embodiment 1.

In FIG. 6, during the switching operation, the semiconductor driving device 10 outputs the determination mask signal MS (Hi level) from the control unit 12 to the gate leakage current detection unit 13, to disable gate leakage current detection.

The determination mask signal MS is canceled (Lo level) at time t3, and gate leakage current detection is performed in the OFF keeping state after the time t3. As a result, the deterioration determination signal DJS is generated at time t4. In this way, gate leakage current detection is performed with high accuracy in a static period, and gate leakage current detection is disabled during switching operation, whereby erroneous operation of the detection circuit can be prevented.

Next, with reference to the time chart shown in FIG. 7, an operation example of the semiconductor driving device 10 after gate leakage current detection will be described.

Figure 5:
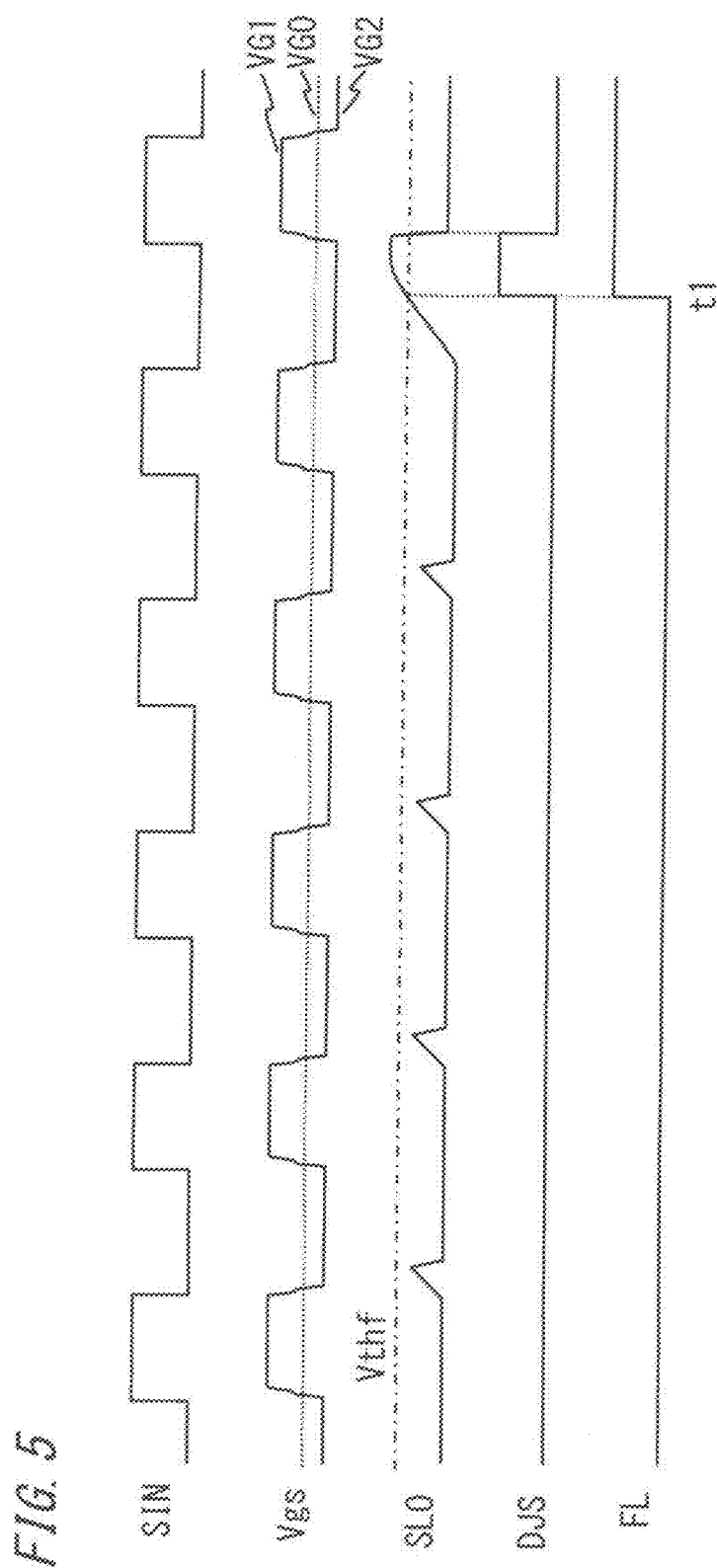
FIG. 5 illustrates a time chart of each signal in the semiconductor driving device according to embodiment 1.

As in the example shown in FIG. 5, a case where gate leakage current is detected in a gate OFF period during switching operation of the semiconductor switching element 50, is shown. In the example shown FIG. 7, the carrier frequency is reduced when the gate leakage current detection signal SLO has become the deterioration determination level Vthf or greater at time t1.

That is, the switching cycle of the semiconductor switching element 50 is changed from TcH to TcL which is a longer cycle than TcH. Thus, switching loss of the semiconductor switching element 50 is reduced and the junction temperature is lowered, whereby progress of deterioration of the gate oxide film can be suppressed.

In the block diagram in FIG. 1, the semiconductor driving device 10 has a configuration in which gate leakage current is detected using the negative-side potential VG2 as a reference in a period in which the gate terminal G of the semiconductor switching element 50 is fixed at the negative-side potential VG2.

Here, a semiconductor driving device 10C having a configuration in which gate leakage current is detected using the positive-side potential VG1 as a reference in a period in which the gate terminal G of the semiconductor switching element 50 is fixed at the positive-side potential VG1, will be described.

Figure 8:
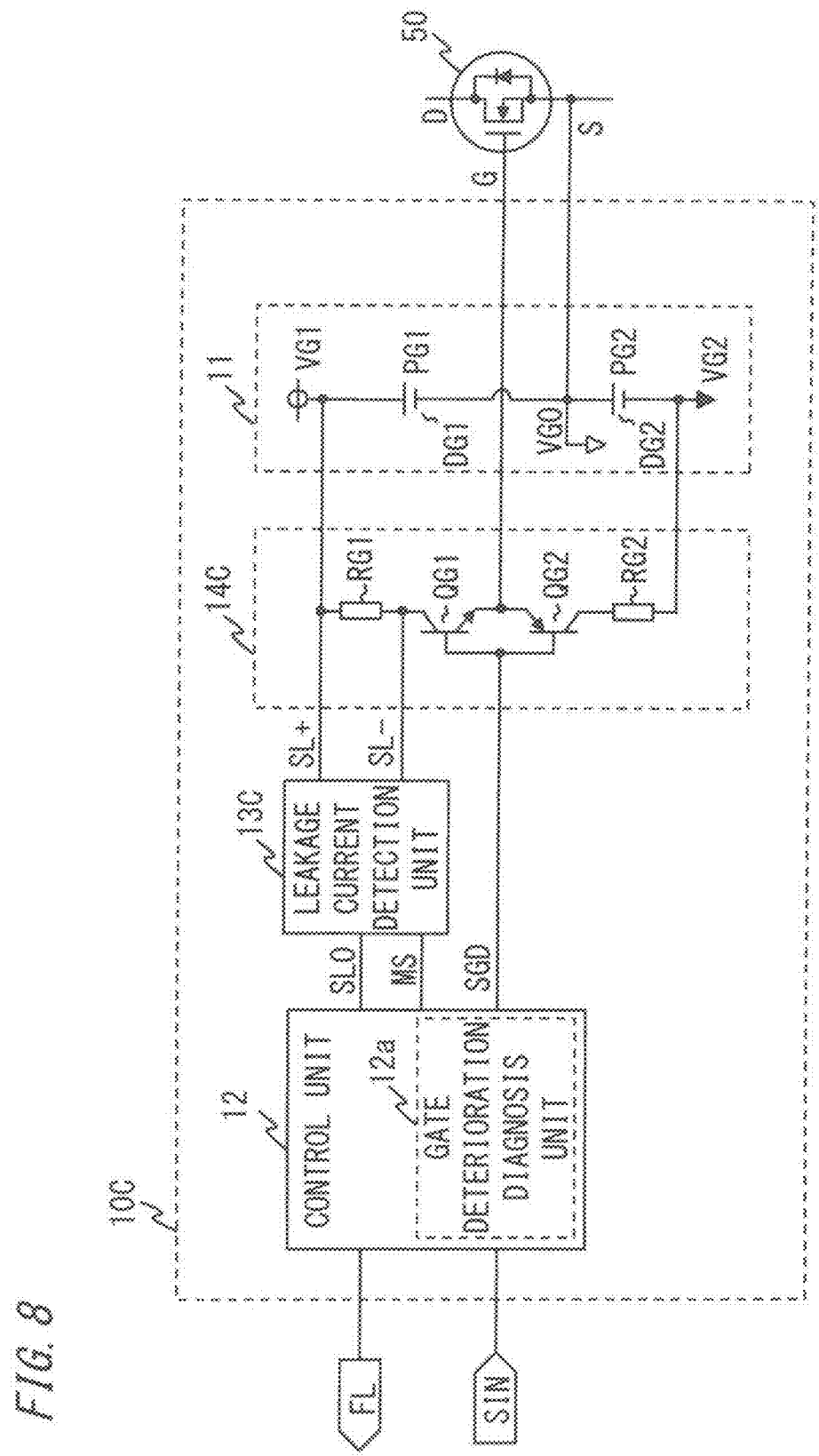
FIG. 8 is a block diagram showing another configuration of the semiconductor driving device according to embodiment 1.

In FIG. 8, the semiconductor driving device, the gate leakage current detection unit, and the gate driving unit are respectively denoted by 10C, 13C, and 14C, for discrimination from the semiconductor driving device 10, the gate leakage current detection unit 13, and the gate driving unit 14 in FIG. 1.

In FIG. 8, the gate leakage current detector unit 13C detects gate leakage current occurring at the ON gate resistor RG1 using the positive-side potential VG1 of the gate power supply unit 11 as a reference. In this configuration, since gate leakage current in a gate ON period is detected, there is an advantage that gate leakage current can be diagnosed also in a case where the gate power supply unit 11 has no DC power supply DG2 (specifically, a case where the reference potential VG0 and the negative-side potential VG2 are the same potential), for example.

Next, operation of the control unit 12 in a case where the semiconductor driving device 10C shown in FIG. 8 performs gate leakage current detection in an OFF keeping state of the semiconductor switching element 50 as described in FIG. 6, will be described.

In a case where the gate power supply unit 11 has no negative-side potential (negative bias is not applied to the gate), determination needs to be performed at the positive-side potential, and therefore it is necessary to perform diagnosis while the semiconductor switching element 50 is turned on in a certain period. If the switching cycle is long (i.e., an ON continuation period is long), it is possible to perform diagnosis in an actual operation period in which the semiconductor switching element 50 performs switching. However, if the switching cycle is short (i.e., an ON continuation period is short), it is necessary to specially provide a certain period in which the semiconductor switching element 50 is turned on.

Figure 14:
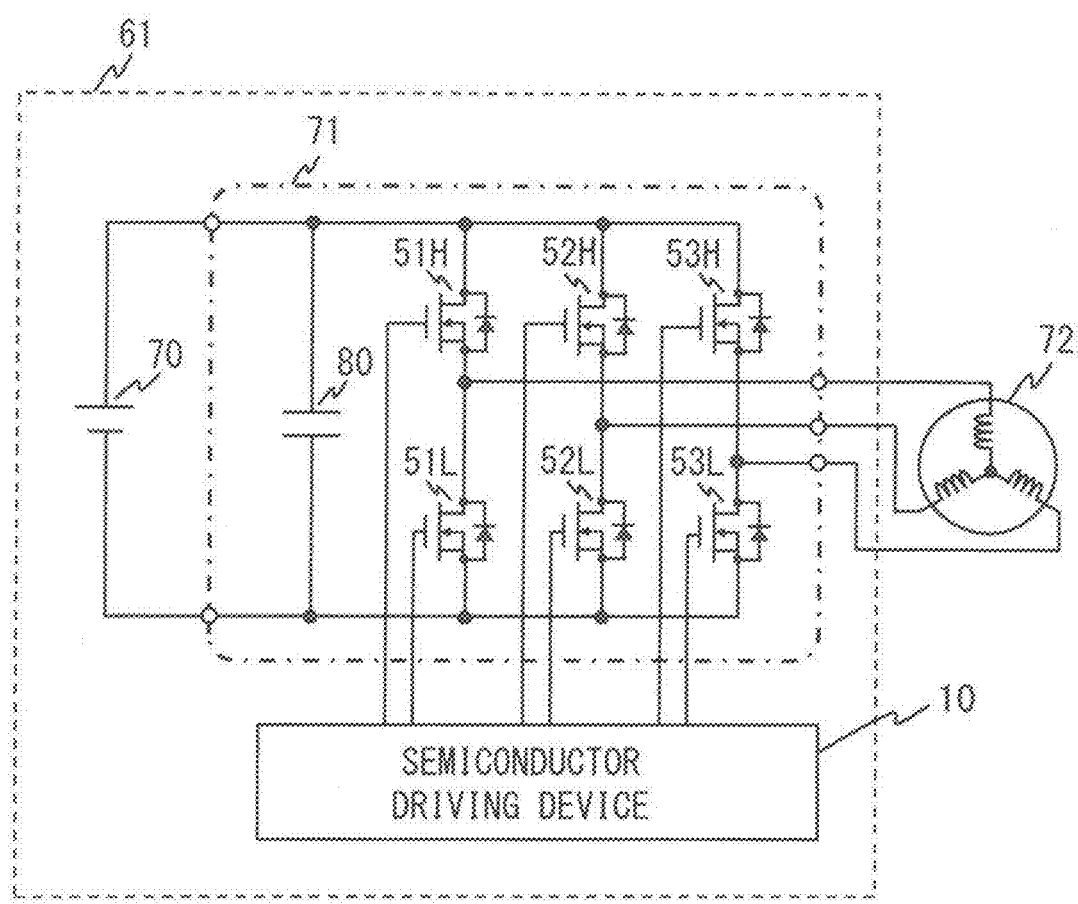
FIG. 14 is a block diagram showing the configuration of a power conversion device according to embodiment 5.

For example, in a case where the semiconductor switching element 50 is used in an inverter device 71 shown in FIG. 14 in embodiment 5, it is possible to perform diagnosis by making a zero vector state in which all upper arms or all lower arms are turned on.

Specifically, in a case of diagnosing gate leakage currents of main semiconductor switching elements 51H, 52H, 53H of the upper arms of the inverter device 71 in FIG. 14, the control unit 12 makes a zero vector state in which all the upper arms are turned on. On the other hand, in a case of diagnosing gate leakage currents of the main semiconductor switching elements 51L, 52L, 53L of the lower arms of the inverter device 71 in FIG. 14, the control unit 12 makes a zero vector state in which all the lower arms are turned on.

By performing diagnosis in such a zero vector state, it is possible to perform diagnosis in a period in which phase voltages of the inverter device 71 are stable, thus providing an effect of preventing erroneous detection of the diagnosis circuit due to noise.

Although the inverter device 71 in FIG. 14 has three phases, the zero vector is applicable to power conversion with two or more phases.

In a case of detecting gate leakage current occurring at the ON gate resistor RG1 using the positive-side potential VG1 of the gate power supply unit 11 as a reference, it is necessary to make a zero vector state (all upper arms or all lower arms are turned on), thus fixing phase voltages at either upper or lower arms so as to be stabilized.

In a case of having no negative-side potential (negative bias is not applied to the gate), determination needs to be performed at the positive-side potential, and therefore it is necessary to perform diagnosis by making such a zero vector state in which all the upper arms or all the lower arms are turned on while the inverter is stopped.

Specifically, for example, a case where the semiconductor switching element 50 is used in the inverter device 71 shown in FIG. 14 in embodiment 5 will be described.

In a case where the semiconductor switching elements 50 for which gate leakage currents are to be detected are the main semiconductor switching elements 51H, 52H, 53H of the upper arms, the control unit 12 makes a zero vector state in which all the upper arms are turned on.

In a case where the semiconductor switching elements 50 for which gate leakage currents are to be detected are the main semiconductor switching elements 51L, 52L, 53L of the lower arms, the control unit 12 makes a zero vector state in which all the lower arms are turned on.

As described above, the semiconductor driving device of embodiment 1 includes a control unit which generates an CN/OFF command for a semiconductor switching element, a gate power supply unit which generates voltage to be applied between a gate terminal and a source terminal of the semiconductor switching element, a gate driving unit which applies the voltage between the gate terminal and the source terminal, and a leakage current detection unit which detects gate leakage current of the semiconductor switching element on the basis of voltage occurring at a gate resistor which limits current for charging a gate of the semiconductor switching element, using a negative-side potential or a positive-side potential of the gate power supply unit as a reference.

Thus, the semiconductor driving device of embodiment 1 can detect slight gate leakage current with high accuracy and achieve deterioration diagnosis before failure of a semiconductor switching element to be driven.

Embodiment 2

A semiconductor driving device of embodiment 2 is provided with discharge resistors for discharging electric charge accumulated in a parasitic capacitance between a gate terminal and a source terminal of a semiconductor switching element.

The semiconductor driving device of embodiment 2 will be described focusing on difference from embodiment 1, with reference to FIG. 9 which is a block diagram showing the configuration of the semiconductor driving device and FIG. 10 which is a block diagram showing another configuration of the semiconductor driving device.

Figure 9:
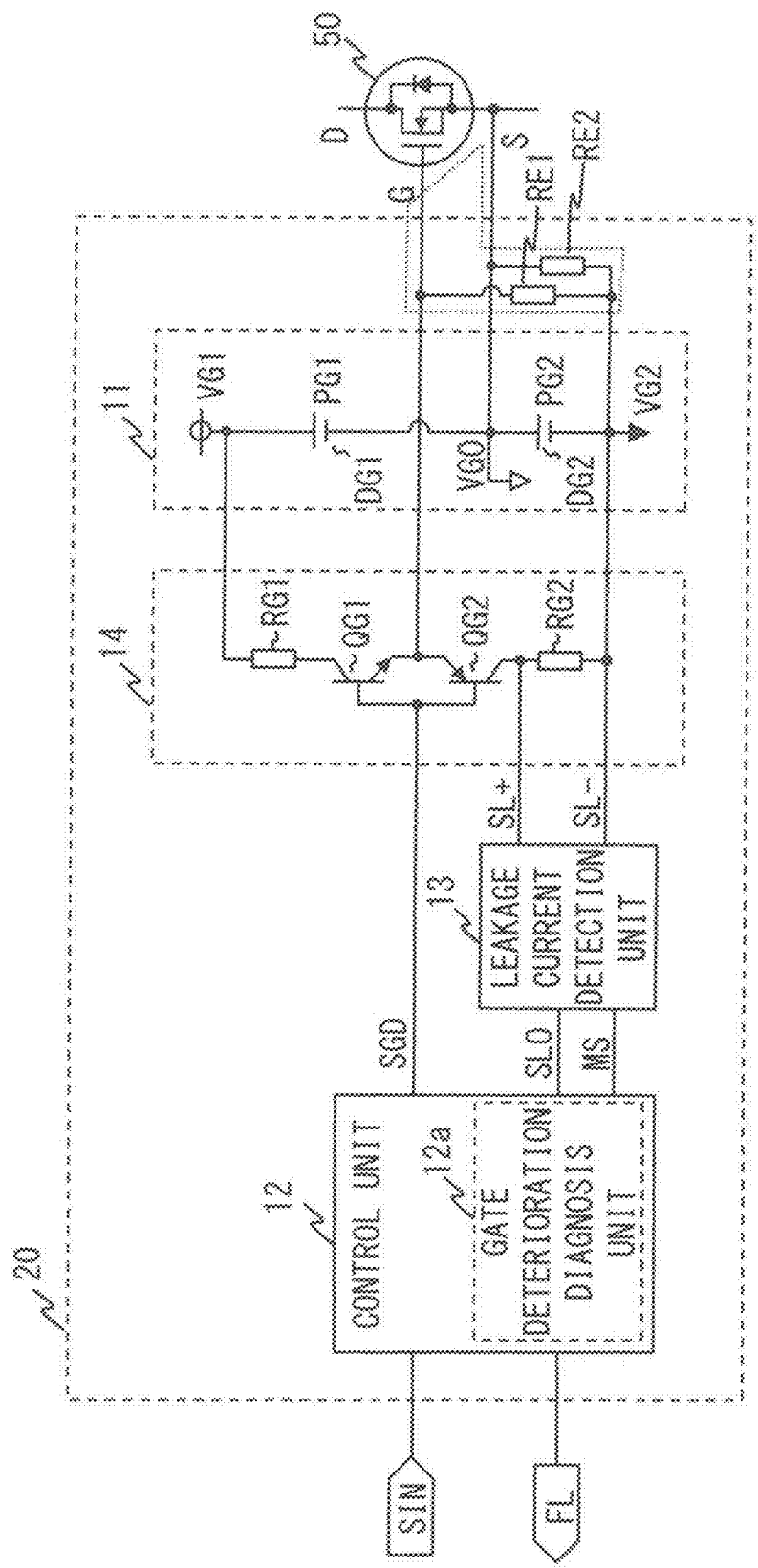
FIG. 9 is a block diagram showing the configuration of a semiconductor driving device according to embodiment 2.
Figure 10:
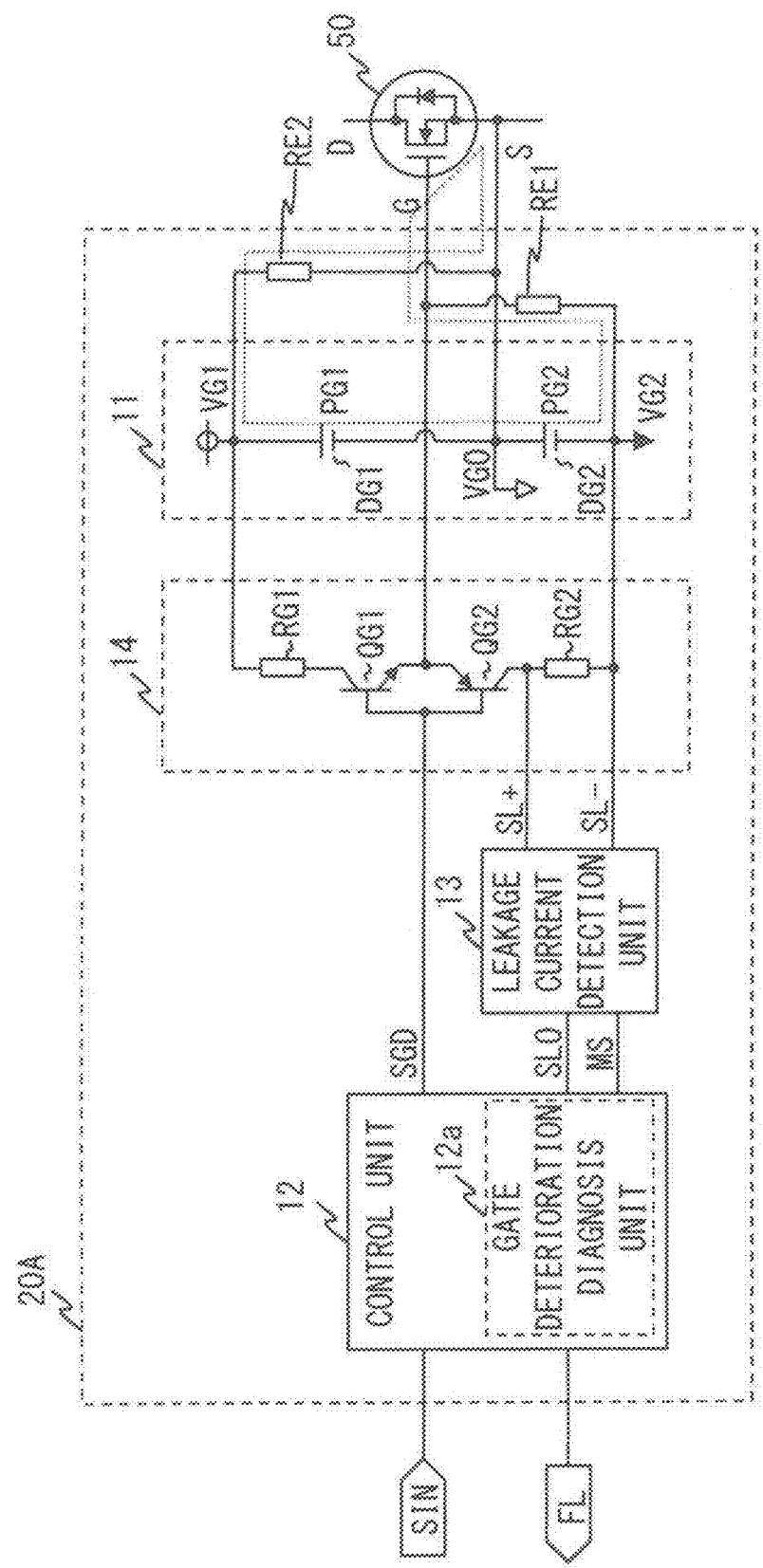
FIG. 10 is a block diagram showing another configuration of the semiconductor driving device according to embodiment 2.

In FIG. 9 and FIG. 10 in embodiment 2, the same or corresponding parts as those in embodiment 1 are denoted by the same reference characters.

The semiconductor driving device is denoted by 20, for discrimination from embodiment 1.

In a conventional semiconductor driving device, a discharge resistor is provided between a gate terminal G and a source terminal S of a semiconductor switching element to be driven. The purpose of this is to prevent the gate from being charged with static electricity when power is not being supplied, or to make the semiconductor switching element into an OFF state at a stage before gate voltage is supplied.

However, if the discharge resistor is provided between the gate terminal G and the source terminal S, the discharge resistor serves as a steady leakage current path, so that detection accuracy for gate leakage current to be originally detected is reduced. For example, if leakage current of the discharge resistor is 500 μA, the detection level for gate leakage current needs to be equal to or higher than that value, for example, needs to be set at 1 mA.

On the other hand, in the semiconductor driving device 20 of embodiment 2, a first discharge resistor RE1 is provided between the gate terminal G and the negative-side potential VG2 which is used as a reference for determination by the gate leakage current detection unit 13, and a second discharge resistor RE2 is provided between the source terminal S and the negative-side potential VG2. Thus, the first discharge resistor RE1 and the second discharge resistor RE2 can be provided in series between the gate terminal G and the source terminal S via the negative-side potential VG2, whereby accumulated static electricity is discharged through a dotted-line path shown in FIG. 9.

Therefore, the resistance values of the first discharge resistor RE1 and the second discharge resistor RE2 may be set at ½ of the conventional value, for example. Since the first discharge resistor RE1 is provided between the gate terminal G and the negative-side potential VG2 which is used as a reference for determination by the gate leakage current detection unit 13, voltage is not applied to the first discharge resistor RE1 in a gate OFF period in which gate leakage current is diagnosed, and therefore leakage current does not occur at the first discharge resistor RE1.

Meanwhile, leakage current flowing through the second discharge resistor RE2 flows in a closed loop formed between the DC power supply DG2 and the second discharge resistor RE2.

Thus, leakage currents of the first discharge resistor RE1 and the second discharge resistor RE2 can be prevented from influencing detection operation of the gate leakage current detection unit 13, whereby high detection accuracy can be achieved.

FIG. 10 is a block diagram of the semiconductor driving device 20 with the second discharge resistor RE2 located at another place. The semiconductor driving device is denoted by 20A, for discrimination from the semiconductor driving device 20 in FIG. 9.

In the semiconductor driving device 20A in FIG. 10, the second discharge resistor RE2 is provided between the source terminal S and the positive-side potential VG1, and when supply of gate power has disappeared, accumulated static electricity is discharged through a dotted-line path in FIG. 10. Also in this case, leakage currents of the first discharge resistor RE1 and the second discharge resistor RE2 can be prevented from influencing detection operation of the gate leakage current detection unit 13, whereby high detection accuracy can be achieved.

As described above, the semiconductor driving device of embodiment 2 is provided with discharge resistors for discharging electric charge accumulated in the parasitic capacitance between the gate terminal G and the source terminal S of the semiconductor switching element.

Thus, the semiconductor driving device of embodiment 2 can detect slight gate leakage current with high accuracy and achieve deterioration diagnosis before failure of a semiconductor switching element to be driven. Further, the semiconductor driving device of embodiment 2 can discharge electric charge accumulated in the parasitic capacitance between the gate terminal and the source terminal of the semiconductor switching element.

Embodiment 3

In embodiment 3, the semiconductor driving device having a configuration to detect gate leakage current using the positive-side potential of the gate power supply unit as a reference is provided with discharge resistors for discharging electric charge accumulated in the parasitic capacitance between the gate terminal and the source terminal of the semiconductor switching element.

The semiconductor driving device of embodiment 3 will be described focusing on difference from embodiments 1 and 2, with reference to FIG. 11 which is a block diagram showing the configuration of the semiconductor driving device.

Figure 11:
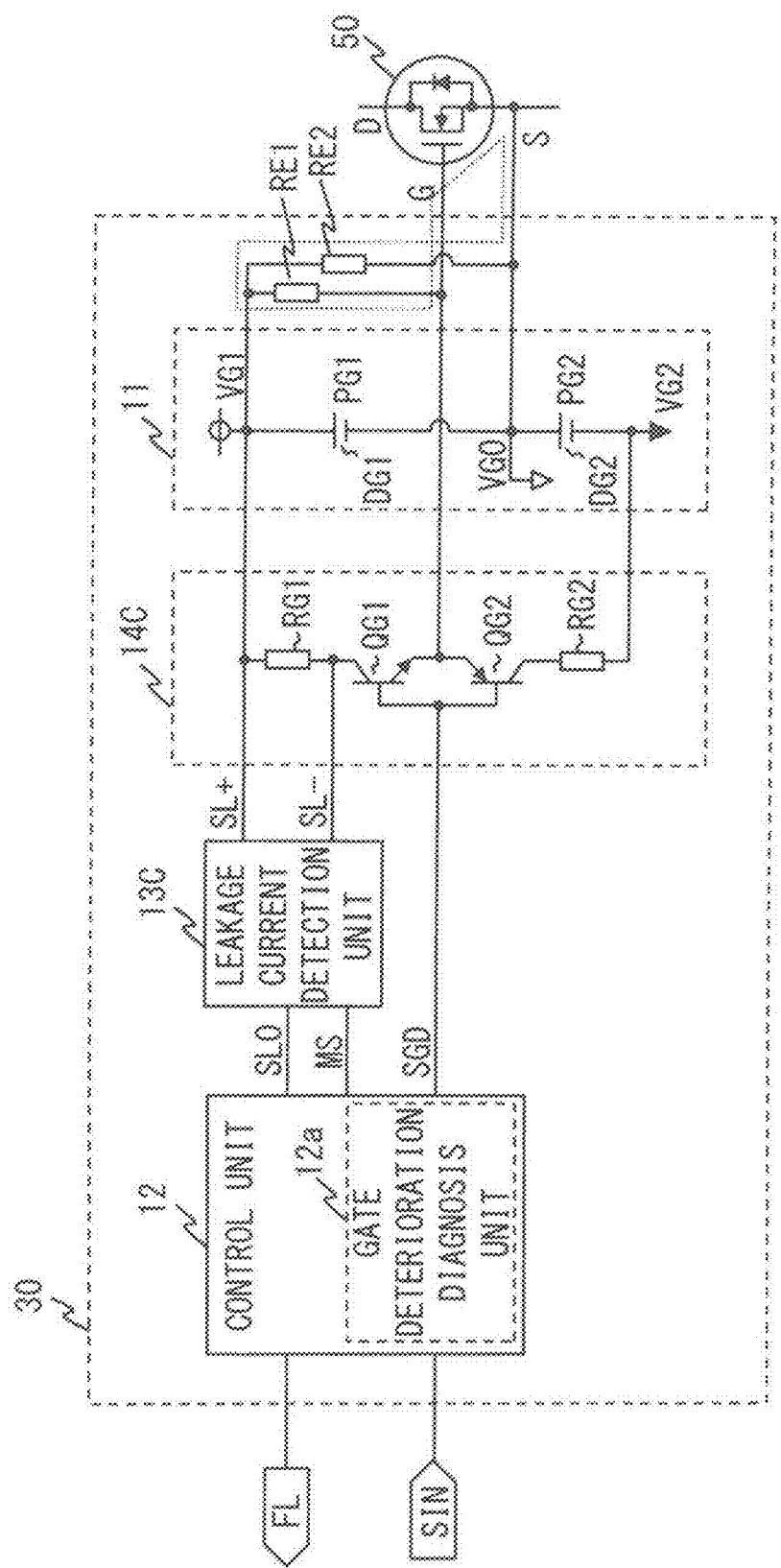
FIG. 11 is a block diagram showing the configuration of a semiconductor driving device according to embodiment 3.

In FIG. 11 in embodiment 3, the same or corresponding parts as those in embodiments 1 and 2 are denoted by the same reference characters.

The semiconductor driving device is denoted by 30, for discrimination from embodiments 1 and 2.

The semiconductor driving device 30 of embodiment 3 is configured such that the first discharge resistor and the second discharge resistor are added to the semiconductor driving device 10C described in FIG. 9 in embodiment 1.

Specifically, the first discharge resistor RE1 is provided between the gate terminal G and the positive-side potential VG1 which is used as a reference for determination by the gate leakage current detection unit 13C, and the second discharge resistor RE2 is provided between the source terminal S and the positive-side potential VG1.

Since the first discharge resistor RE1 is provided between the gate terminal G and the positive-side potential VG1 which is used as a reference for determination by the gate leakage current detection unit 13C, voltage is not applied to the first discharge resistor RE1 in a gate OFF period in which gate leakage current is diagnosed, and therefore leakage current does not occur at the first discharge resistor RE1.

Meanwhile, leakage current flowing through the second discharge resistor RE2 flows in a closed loop formed between the DC power supply DG1 and the second discharge resistor RE2 and shown by a dotted line in FIG. 11.

Thus, leakage currents of the first discharge resistor RE1 and the second discharge resistor RE2 can be prevented from influencing detection operation of the gate leakage current detection unit 13C, whereby high detection accuracy can be achieved.

As described above, the semiconductor driving device of embodiment 3 is configured such that discharge resistors for discharging electric charge accumulated in the parasitic capacitance between the gate terminal and the source terminal of the semiconductor switching element are provided to the semiconductor driving device having a configuration to detect gate leakage current using the positive-side potential of the gate power supply unit as a reference.

Thus, the semiconductor driving device of embodiment 3 can detect slight gate leakage current with high accuracy and achieve deterioration diagnosis before failure of a semiconductor switching element to be driven. Further, the semiconductor driving device of embodiment 3 can discharge electric charge accumulated in the parasitic capacitance between the gate terminal and the source terminal of the semiconductor switching element.

Embodiment 4

A semiconductor driving device of embodiment 4 is provided with a switchover mechanism for the OFF gate resistor.

Figure 12:
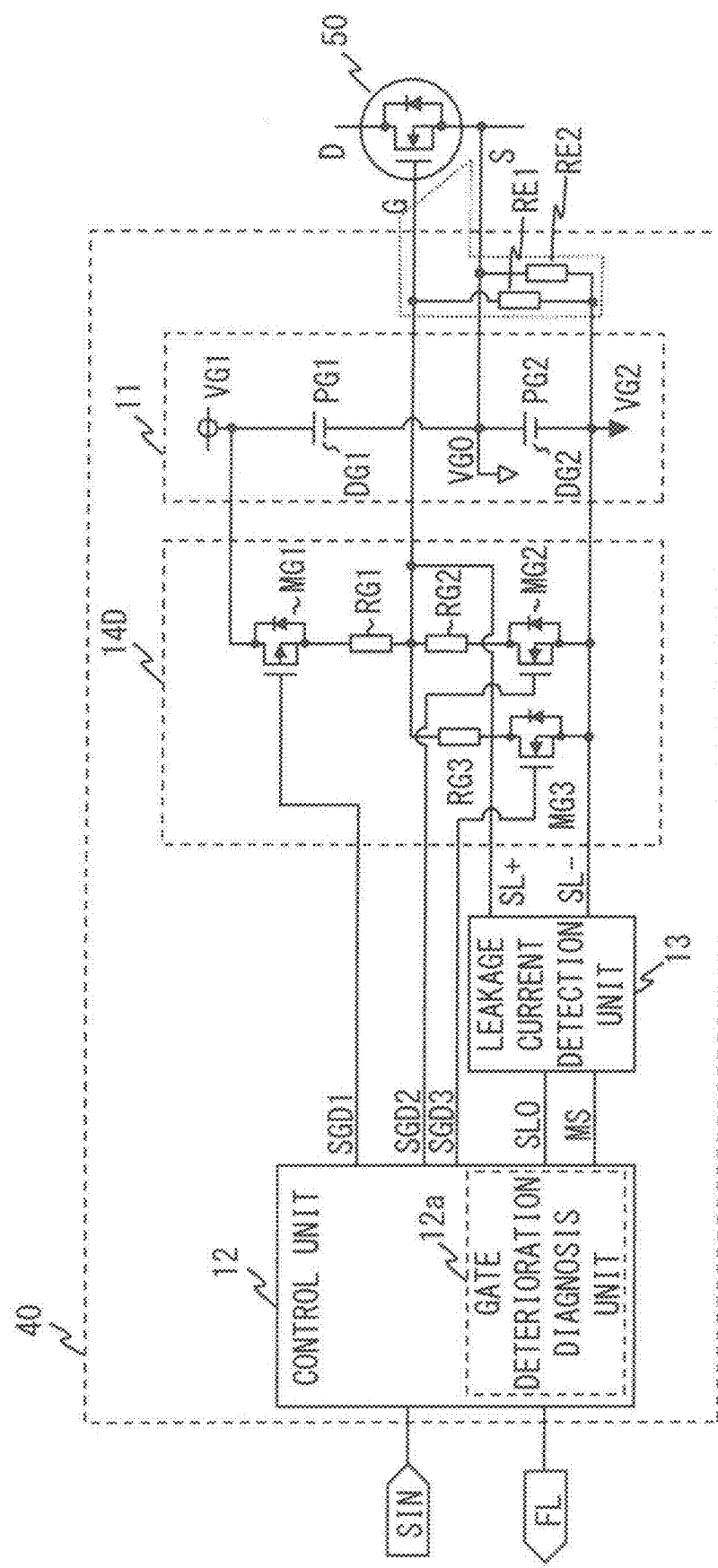
FIG. 12 is a block diagram showing the configuration of a semiconductor driving device according to embodiment 4.

The semiconductor driving device of embodiment 4 will be described focusing on difference from embodiment 1, with reference to FIG. 12 which is a block diagram showing the configuration of the semiconductor driving device and FIG. 13 which illustrates a time chart of each signal in the semiconductor driving device.

In the configuration diagram in embodiment 4, the same or corresponding parts as those in embodiment 1 are denoted by the same reference characters.

The semiconductor driving device, the control unit, and the gate driving unit are respectively denoted by 40, 12D, and 14D, for discrimination from embodiment 1.

The semiconductor driving device 40 according to embodiment 4 is a configuration example in which a switchover mechanism for the OFF gate resistor is provided to the semiconductor driving device 10B shown in FIG. 4 in embodiment 1.

First, components added in the semiconductor driving device 10B will be described.

A second OFF gate resistor RG3 and a transistor MG3 which is a P-MOSFET are connected between the negative-side potential VG2 (the input terminal SL− of the gate leakage current detection unit 13) and a connection point between the ON gate resistor RG1 and the OFF gate resistor RG2 connected to the gate terminal G of the semiconductor switching element 50. For driving the transistor MG3, a gate driving command SGD3 is outputted from the control unit 12D to a gate terminal of the transistor MG3.

The second OFF gate resistor RG3 having a greater resistance value than the OFF gate resistor RG2, the transistor MG3, and the gate driving command SGD3 are added. The semiconductor driving device 40 has a switchover mechanism from the OFF gate resistor RG2 to the second OFF gate resistor RG3 by providing the second OFF gate resistor RG3 in parallel to the OFF gate resistor RG2.

That is, it is possible to switch from the OFF gate resistor RG2 to the second OFF gate resistor RG3 by switching from a state in which the transistor MG2 is ON and the transistor MG3 is OFF to a state in which the transistor MG2 is OFF and the transistor MG3 is ON.

In addition, it is possible to switch from a parallel configuration of the OFF gate resistor RG2 and the second OFF gate resistor RG3 to the second OFF gate resistor RG3 alone by switching from a state in which the transistor MG2 is ON and the transistor MG3 is ON to a state in which the transistor MG2 is OFF and the transistor MG3 is ON.

Here, the OFF gate resistor RG2 and the second OFF gate resistor RG3 correspond to a gate resistor in the claims.

Figure 13:
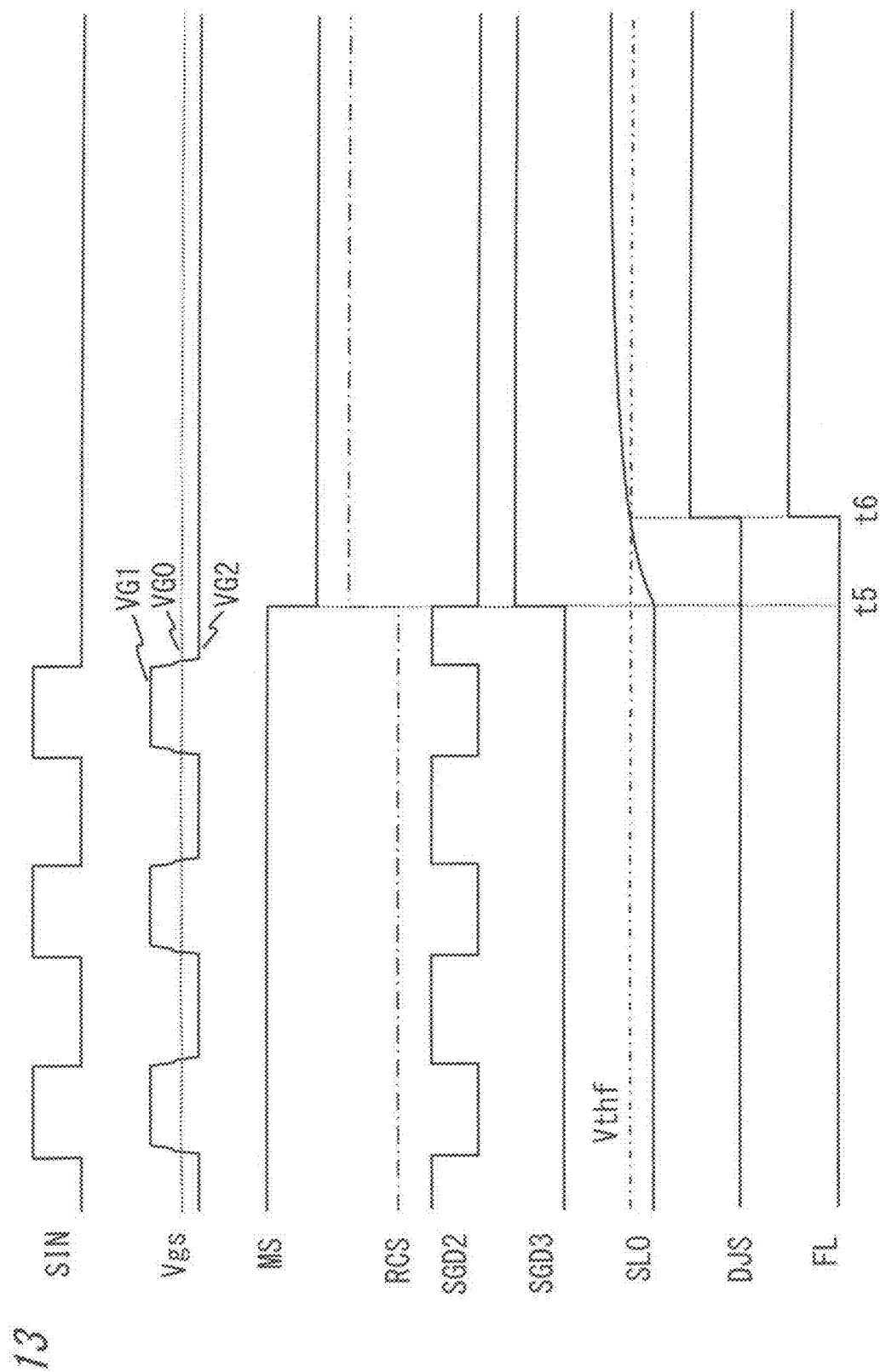
FIG. 13 illustrates a time chart of each signal in the semiconductor driving device according to embodiment 4.

In the time chart shown in FIG. 13, in a switching operation period before time t5, the determination mask signal MS is outputted from the control unit 12 to the gate current detection unit 13, to disable detection for gate leakage current, thereby preventing erroneous detection.

After time t5, the determination mask signal MS is canceled. Further, the transistor MG2 is turned off by the gate driving command SGD2 and the transistor MG3 is turned on by the gate driving command SGD3, to change the OFF gate resistor to the one having a greater value, and gate leakage current is detected. As a result, at time t6, the gate leakage current detection signal SLO becomes the deterioration determination level Vthf or greater, so that the deterioration determination signal DJS for the gate withstand voltage of the semiconductor switching element 50 is generated and the fail signal FL is generated.

Switch of the OFF gate resistors is performed by the gate driving commands SGD2, SGD3, and an independent resistor switchover signal is not provided. However, for facilitating understanding of switchover of the OFF gate resistors, a resistor switchover signal RCS as a virtual signal is indicated by a dotted-dashed line in the time chart in FIG. 13.

The semiconductor driving device 40 according to embodiment 4 is configured to detect gate leakage current by increasing the OFF gate resistor value in a period in which switching operation is stopped, whereby leakage current can be detected with higher sensitivity.

The value of the OFF gate resistor during switching operation is constrained by requirement of noise erroneous operation resistance and switching characteristics. However, in a static state in which switching is stopped, changing the OFF gate resistor to a great value to a certain extent brings about no influence. The semiconductor driving device 40 according to embodiment 4 is made considering such a feature, and for example, if the gate resistor value is increased by ten times, detection sensitivity for gate leakage current can be enhanced by ten times.

As described above, the semiconductor driving device of embodiment 4 is provided with the switchover mechanism for the OFF gate resistor.

Thus, the semiconductor driving device of embodiment 4 can detect slight gate leakage current with high accuracy and achieve deterioration diagnosis before failure of a semiconductor switching element to be driven. Further, the semiconductor driving device of embodiment 4 can enhance detection sensitivity for gate leakage current.

Embodiment 5

A power conversion device of embodiment 5 is configured such that a power conversion unit is an inverter device, and has a function of detecting gate leakage current of a main semiconductor switching element of the inverter device.

The power conversion device of embodiment 5 will be described with reference to FIG. 14 which is a block diagram showing the configuration of the power conversion device.

In a power conversion device 61 according to embodiment 5, any of the semiconductor driving devices 10, 20, 30, 40 described in embodiments 1 to 4 is used.

In the following description, the semiconductor driving devices 10, 10A, 10B, 10C described in embodiment 1 are collectively referred to as semiconductor driving device 10. The semiconductor driving devices 20, 20A described in embodiment 2 are collectively referred to as semiconductor driving device 20.

In FIG. 14, the semiconductor driving device 10 described in embodiment 1 is shown as a representative of the semiconductor driving device.

The power conversion device 61 of embodiment 5 is composed of the semiconductor driving device 10 and an inverter device 71 as a power conversion unit. Here, an example in which the inverter device 71 drives a motor 72 is shown.

The inverter device 71 is a so-called three-phase inverter including main semiconductor switching elements 51H, 52H, 53H on the upper arm side, main semiconductor switching elements 51L, 52L, 53L on the lower arm side, and a smoothing capacitor 80.

For example, the semiconductor switching element 50 of the semiconductor driving device 10 of embodiment 1 corresponds to each of the main semiconductor switching elements 51H, 52H, 53H on the upper arm side and the main semiconductor switching elements 51L, 52L, 53L on the lower arm side.

DC power supplied from a DC power supply 70 is converted to three-phase AC power, and the converted AC power is supplied to the motor 72 which is an AC load.

In the power conversion device 61 shown in FIG. 14, as an example, power MOSFETs are used as the main semiconductor switching elements 51H, 51L, 52H, 52L, 53H, 53L.

Thus, in the power conversion device 61 of embodiment 5, the semiconductor driving device of any of embodiments 1 to 4 is used for the inverter device, whereby deterioration in the gate withstand voltage of the main semiconductor switching element is diagnosed, thus allowing replacement of the main semiconductor switching element at an appropriate timing before leading to unplanned stop of the device.

As described above, the power conversion device of embodiment 5 is configured such that a power conversion unit is an inverter device, and has a function of detecting gate leakage current of a main semiconductor switching element of the inverter device.

Thus, the power conversion device of embodiment 5 can detect slight gate leakage current with high accuracy and achieve deterioration diagnosis before failure of a main semiconductor switching element to be driven.

Embodiment 6

A power conversion device of embodiment 6 is configured such that a power conversion unit is a boost converter device, and has a function of detecting gate leakage current of a main semiconductor switching element of the boost converter device.

The power conversion device of embodiment 6 will be described with reference to FIG. 15 which is a block diagram showing the configuration of the power conversion device.

In a power conversion device 62 according to embodiment 6, any of the semiconductor driving devices 10, 20, 30, 40 described in embodiments 1 to 4 is used.

Figure 15:
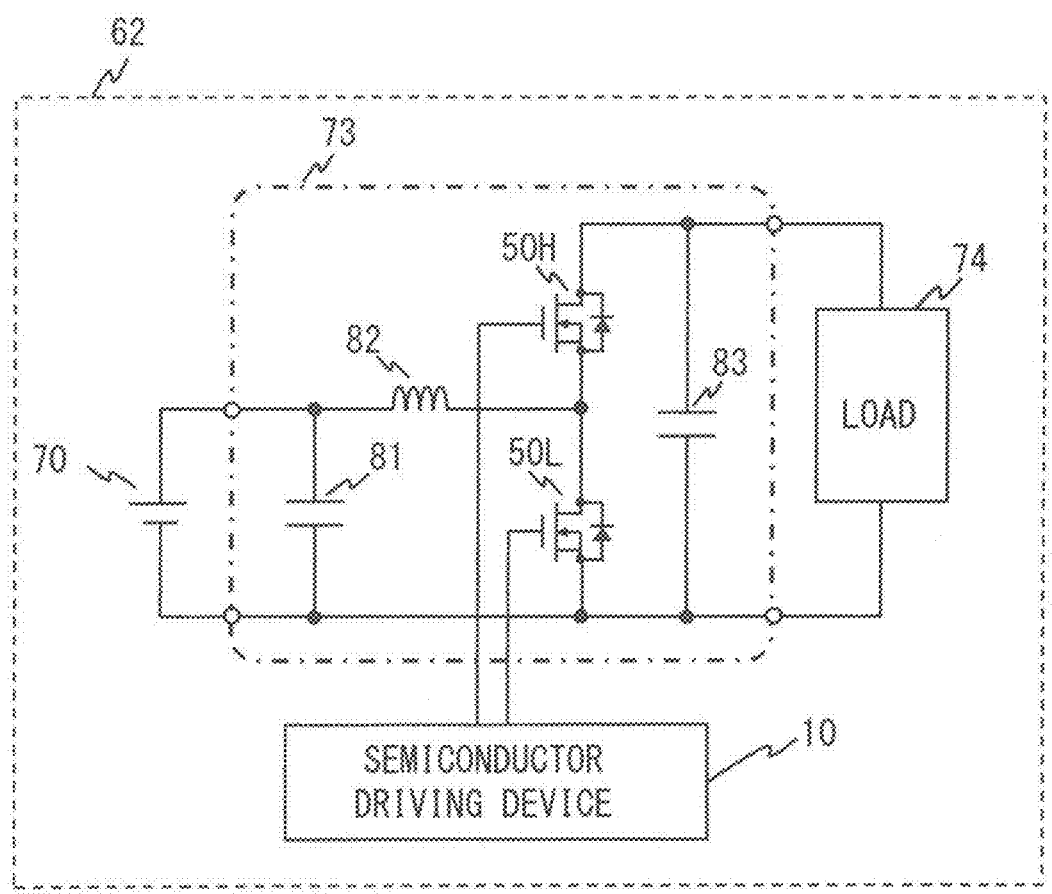
FIG. 15 is a block diagram showing the configuration of a power conversion device according to embodiment 6.

In FIG. 15, the semiconductor driving device 10 described in embodiment 1 is shown as a representative of the semiconductor driving device.

The power conversion device 62 of embodiment 6 is composed of the semiconductor driving device 10 and a boost converter device 73 as a power conversion unit.

Here, an example in which the boost converter device 73 supplies power to a DC load 74 is shown. The power conversion device 62 of embodiment 6 is composed of main semiconductor switching elements 50H, 50L, smoothing capacitors 81, 83, and a boost reactor 82.

For example, the semiconductor switching element 50 of the semiconductor driving device 10 of embodiment 1 corresponds to each of the main semiconductor switching elements 50H, 50L.

The main semiconductor switching elements 50H, 50L used here are power MOSFETs, as an example. In embodiment 6, in order to downsize the boost reactor 82, high-speed semiconductor switching elements made of a wide bandgap semiconductor material can be applied as the main semiconductor switching elements 50H, 50L.

As the wide bandgap semiconductor material, any of silicon carbide (SiC), gallium nitride, a gallium-oxide-based material, or diamond can be used.

In particular, in a case where the main semiconductor switching element is made of a wide bandgap semiconductor material capable of high-temperature operation, there is concern that the gate oxide film might be deteriorated under high temperature. In this regard, by using the semiconductor driving device 10, 20, 30, 40 according to any of embodiments 1 to 4, gate leakage current is detected with high accuracy and deterioration in the gate withstand voltage of the main semiconductor switching element is diagnosed, thus allowing replacement of the main semiconductor switching element at an appropriate timing before leading to unplanned stop of the device.

In embodiment 6, the example in which the boost converter device 73 is used as the power conversion device 62 has been shown. However, the present disclosure is not limited thereto, and is also applicable to a buck converter with the DC power supply 70 and the DC load 74 replaced with each other, or a buck-boost converter having a boost converter and a buck converter in combination.

Thus, in the power conversion device according to embodiment 6, the semiconductor driving device according to any of embodiments 1 to 4 is used for the boost converter device, whereby deterioration in the gate withstand voltage before breakage of the main semiconductor switching element is diagnosed, thus allowing replacement of the main semiconductor switching element at an appropriate timing without leading to unplanned stop of operation.

As described above, the power conversion device of embodiment 6 is configured such that a power conversion unit is a boost converter device, and has a function of detecting gate leakage current of the main semiconductor switching element of the boost converter device.

Thus, the power conversion device of embodiment 5 can detect slight gate leakage current with high accuracy and achieve deterioration diagnosis before failure of a main semiconductor switching element to be driven.

Embodiment 7

A power conversion device of embodiment 7 is configured such that a power conversion unit is a boost-type inverter system, and has a function of detecting gate leakage current of a main semiconductor switching element of the boost-type inverter system.

The power conversion device of embodiment 7 will be described with reference to FIG. 16 which is a block diagram showing the configuration of the power conversion device.

In a power conversion device 63 according to embodiment 7, any of the semiconductor driving devices 10, 20, 30, 40 described in embodiments 1 to 4 is used.

Figure 16:
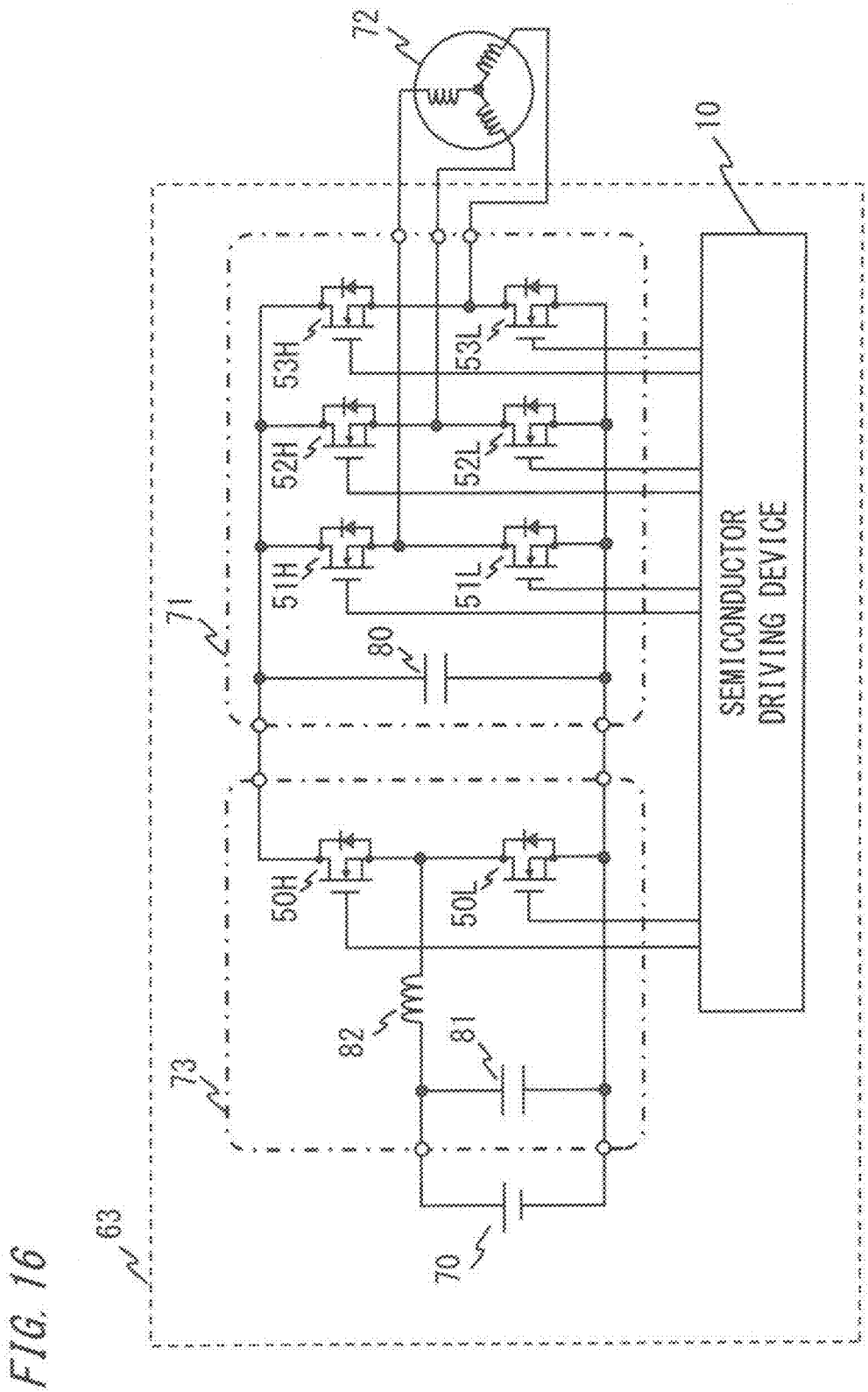
FIG. 16 is a block diagram showing the configuration of a power conversion device according to embodiment 7.

In FIG. 16, the semiconductor driving device 10 described in embodiment 1 is shown as a representative of the semiconductor driving device.

The power conversion device 63 of embodiment 7 is a boost-type inverter system, and is composed of the inverter device 71 shown in FIG. 14 and the boost converter device 73 shown in FIG. 15.

Here, DC power supplied from the DC power supply 70 is boosted by the boost converter device 73, and the boosted DC power is converted to AC power by the inverter device 71. Further, the converted AC power is supplied to the motor 72 which is an AC load, to drive the motor 72.

In FIG. 16, the smoothing capacitor 83 shown in FIG. 15 is omitted.

The power conversion device 63 of embodiment 7 is applied to an electric vehicle, for example.

Also in the power conversion device 63 according to embodiment 7, the same effects as those in embodiments 5 and 6 can be expected by using the semiconductor driving device 10, 20, 30, 40 according to any of embodiments 1 to 4.

In the example shown in FIG. 16, the power conversion device 63 including the boost converter device 73 and the inverter device 71 has been shown. However, the semiconductor driving device 10, 20, 30, 40 of any of embodiments 1 to 4 may be applied also to a power conversion device including a buck converter device or a buck-boost converter device, instead of the boost converter device 73.

In addition, the semiconductor driving device 10, 20, 30, 40 according to any of embodiments 1 to 4 may be applied also to a power conversion device including an AC-DC converter device for converting AC power to DC power, instead of the inverter device 71.

As described above, in the power conversion device according to embodiment 7, by applying the semiconductor driving device of any of embodiments 1 to 4 to the boost-type inverter system, as in embodiments 5 and 6, deterioration in the gate withstand voltage before breakage of the main semiconductor switching element is diagnosed, thus allowing replacement of the main semiconductor switching element at an appropriate timing without causing unplanned stop of operation.

In embodiment 7, the example in which MOSFETs are used as the main semiconductor switching elements has been described. However, the main semiconductor switching elements are not limited thereto. For example, main semiconductor switching elements having a MOS gate structure, such as IGBTs, instead of MOSFETs, may be used.

In embodiment 7, a two-level power conversion device in which two main semiconductor switching elements are connected in series has been shown as an example. However, the present disclosure is not limited thereto, and is applicable also to a multilevel power conversion device in which any number of main semiconductor switching elements are connected in series.

As described above, the power conversion device of embodiment 7 is configured such that a power conversion unit is a boost-type inverter system, and has a function of detecting gate leakage current of a main semiconductor switching element of the boost-type inverter system.

Thus, the power conversion device of embodiment 5 can detect slight gate leakage current with high accuracy and achieve deterioration diagnosis before failure of a main semiconductor switching element to be driven.

Figure 17:
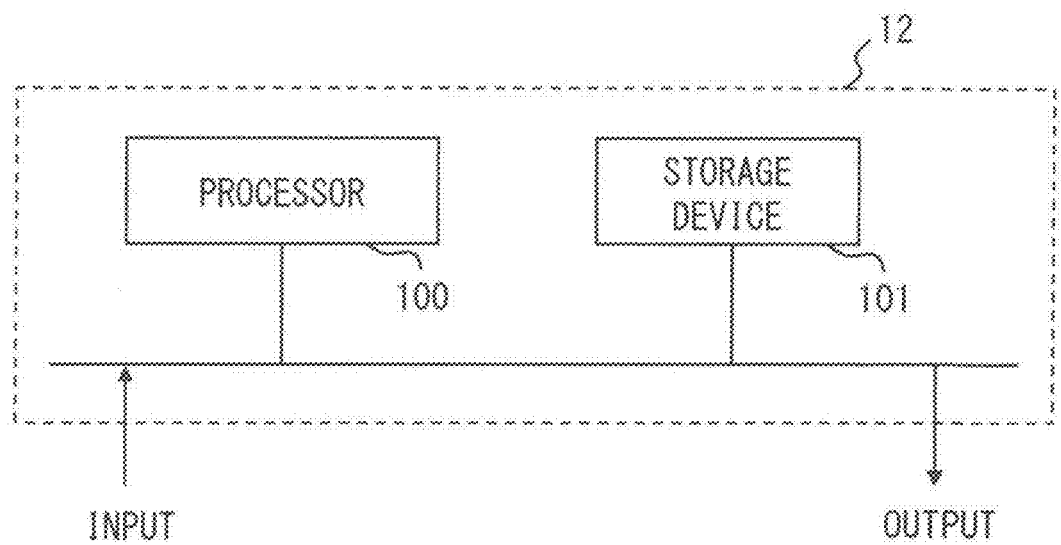
FIG. 17 is a block diagram showing the configuration of a control unit of a power driving device.

The control unit 12 is composed of a processor 10C and a storage device 101, as shown in FIG. 17 which shows an example of hardware. Although not shown, the storage device is provided with a volatile storage device such as a random access memory, and a nonvolatile auxiliary storage device such as a flash memory.

Instead of the flash memory, an auxiliary storage device of a hard disk may be provided. The processor 100 executes a program inputted from the storage device 101. In this case, the program is inputted from the auxiliary storage device to the processor 100 via the volatile storage device. The processor 100 may output data such as a calculation result to the volatile storage device of the storage device 101, or may store such data into the auxiliary storage device via the volatile storage device.

Although the disclosure is described above in terms of various exemplary embodiments and implementations, it should be understood that the various features, aspects, and functionality described in one or more of the individual embodiments are not limited in their applicability to the particular embodiment with which they are described, but instead can be applied, alone or in various combinations to one or more of the embodiments of the disclosure.

It is therefore understood that numerous modifications which have not been exemplified can be devised without departing from the scope of the present disclosure. For example, at least one of the constituent components may be modified, added, or eliminated. At least one of the constituent components mentioned in at least one of the preferred embodiments may be selected and combined with the constituent components mentioned in another preferred embodiment.

DESCRIPTION OF THE REFERENCE CHARACTERS

10, 10A, 10B, 10C, 20, 20A, 30, 40 semiconductor driving device
11 gate power supply unit
12 control unit
13, 13C gate leakage current detection unit
14, 14A, 14B, 14C, 14D gate driving unit
50 semiconductor switching element
12a gate deterioration diagnosis unit
61, 62, 63 power conversion device
70 DC power supply
71 inverter device
72 motor
73 boost converter device
74 DC load
80, 81, 83 smoothing capacitor
82 boost reactor
50H, 51H, 52H, 53H main semiconductor switching element
50L, 51L, 52L, 53L main semiconductor switching element
100 processor
101 storage device
QG1 transistor
QG2 transistor MG1 transistor
MG2 transistor
MG3 transistor
RG gate resistor
RG1 ON gate resistor
RG2 OFF gate resistor
RG3 second OFF gate resistor
RE1 first discharge resistor
RE2 second discharge resistor
DG1 DC power supply
DG2 DC power supply
CP1 operational amplifier
CP1 comparator
R1, R2 input resistor
R3 feedback resistor
R4 resistor
D1, D2 clamp diode
C1 capacitor
AD1 AND circuit
IV1 inversion circuit

The invention claimed is:

1. A semiconductor driving device for performing ON/OFF control of a semiconductor switching element by applying gate voltage, the semiconductor driving device comprising:
a control circuitry which generates an ON/OFF command for the semiconductor switching element;
a gate power supply circuitry which generates voltage to be applied between a gate terminal of the semiconductor switching element and a reference terminal serving as a reference for the gate voltage;
a gate driving circuitry which has a first transistor of a first type directly connected to a positive potential of the gate power supply circuitry and a second transistor of a second type that is different from the first type directly connected to a negative potential of the gate power supply circuitry, and applies the voltage generated by the gate power supply circuitry, between the gate terminal and the reference terminal; and
a gate leakage current detection circuitry which detects gate leakage current of the semiconductor switching element on the basis of voltage occurring between both terminals of a circuit having a gate resistor which limits current for charging a gate of the semiconductor switching element and the first transistor, or a circuit having the gate resistor and the second transistor, using a negative-side potential or a positive-side potential of the gate power supply circuitry as a reference,
wherein the control circuitry diagnoses deterioration in gate withstand voltage of the semiconductor switching element on the basis of a value of the gate leakage current detected by the gate leakage current detection circuitry in a period in which a gate potential of the semiconductor switching element is fixed at the potential used as the reference by the gate leakage current detection circuitry, of the positive-side potential or the negative-side potential, during switching operation in which the semiconductor switching element repeats ON/OFF operation.

2. The semiconductor driving device according to claim 1, wherein
the gate driving circuitry includes a switchover mechanism for the gate resistor to be used for detection of the gate leakage current by the gate leakage current detection circuitry, and
the control circuitry diagnoses deterioration in gate withstand voltage of the semiconductor switching element on the basis of a value of the gate leakage current detected by the gate leakage current detection circuitry in a period in which the gate resistor is switched so that a value of the gate resistor is increased.

3. The semiconductor driving device according to claim 2, wherein
in a case where a value of the gate leakage current detected by the gate leakage current detection circuitry exceeds a reference value set from characteristics of the semiconductor switching element, or a case where an increase amount of a value of the gate leakage current detected by the gate leakage current detection circuitry exceeds a reference increase amount, the control circuitry generates a deterioration determination signal, and records or displays generation of the deterioration determination signal.

4. A power conversion device comprising:
the semiconductor driving device according to claim 2; and
a power conversion circuitry composed of main semiconductor switching elements of an upper arm and a lower arm connected in series, for converting inputted power and outputting the converted power.

5. The semiconductor driving device according to claim 1, wherein
in a case where a value of the gate leakage current detected by the gate leakage current detection circuitry exceeds a reference value set from characteristics of the semiconductor switching element, or a case where an increase amount of a value of the gate leakage current detected by the gate leakage current detection circuitry exceeds a reference increase amount, the control circuitry generates a deterioration determination signal, and records or displays generation of the deterioration determination signal.

6. The semiconductor driving device according to claim 5, wherein
the control circuitry further performs control so as to perform any of stopping switching operation of the semiconductor switching element, reducing a cycle of the switching operation, changing a modulation method or a modulation factor for the switching operation, or reducing load current of the semiconductor driving device.

7. A power conversion device comprising:
the semiconductor driving device according to claim 1; and
a power conversion circuitry composed of main semiconductor switching elements of an upper arm and a lower arm connected in series, for converting inputted power and outputting the converted power.

8. The power conversion device according to claim 7, wherein
the main semiconductor switching elements composing the power conversion circuitry are wide bandgap semiconductors made of any semiconductor material of silicon carbide, gallium nitride, a gallium-oxide-based material, or diamond.

9. The power conversion device according to claim 7, wherein
the power conversion circuitry is configured as any of an inverter device for converting DC power to AC power, a boost converter device for boosting voltage of DC power, a buck converter device for stepping down voltage of DC power, an AC-DC converter device for converting AC power to DC power, a boost-type inverter device including the boost converter device and the inverter device, or a buck-type inverter device including the buck converter device and the inverter device.

10. The power conversion device according to claim 9, wherein
the main semiconductor switching elements composing the power conversion circuitry are wide bandgap semiconductors made of any semiconductor material of silicon carbide, gallium nitride, a gallium-oxide-based material, or diamond.

11. A semiconductor driving device for performing ON/OFF control of a semiconductor switching element by applying gate voltage, the semiconductor driving device comprising:
a control circuitry which generates an ON/OFF command for the semiconductor switching element;
a gate power supply circuitry which generates voltage to be applied between a gate terminal of the semiconductor switching element and a reference terminal serving as a reference for the gate voltage;
a gate driving circuitry which applies the voltage generated by the gate power supply circuitry, between the gate terminal and the reference terminal, the gate driving circuitry including at least a first transistor of a first type and a second transistor of a second type different than the first type; and
a gate leakage current detection circuitry which detects gate leakage current of the semiconductor switching element on the basis of voltage occurring between both terminals of a gate resistor which limits current for charging a gate of the semiconductor switching element, using a negative-side potential or a positive-side potential of the gate power supply circuitry as a reference,
further comprising:
a first discharge resistor connecting the gate terminal and a connection point of the potential used as the reference by the gate leakage current detection circuitry, of the positive-side potential and the negative-side potential of the gate power supply circuitry; and
a second discharge resistor connecting the reference terminal and a connection point of either the positive-side potential or the negative-side potential,
wherein the control circuitry diagnoses deterioration in gate withstand voltage of the semiconductor switching element on the basis of a value of the gate leakage current detected by the gate leakage current detection circuitry in a period in which a gate potential of the semiconductor switching element is fixed at the potential used as the reference by the gate leakage current detection circuitry, of the positive-side potential or the negative-side potential, during switching operation in which the semiconductor switching element repeats ON/OFF operation.

12. The semiconductor driving device according to claim 11, wherein
in a case where a value of the gate leakage current detected by the gate leakage current detection circuitry exceeds a reference value set from characteristics of the semiconductor switching element, or a case where an increase amount of a value of the gate leakage current detected by the gate leakage current detection circuitry exceeds a reference increase amount, the control circuitry generates a deterioration determination signal, and records or displays generation of the deterioration determination signal.

13. A power conversion device comprising:
the semiconductor driving device according to claim 11; and
a power conversion circuitry composed of main semiconductor switching elements of an upper arm and a lower arm connected in series, for converting inputted power and outputting the converted power.

14. A semiconductor driving device for performing ON/OFF control of one or more semiconductor switching elements by applying gate voltage, the semiconductor driving device comprising:
a control circuitry which generates an ON/OFF command for the one or more semiconductor switching elements;
a gate power supply circuitry which generates voltage to be applied between a gate terminal of the one or more semiconductor switching elements and a reference terminal serving as a reference for the gate voltage;
a gate driving circuitry which applies the voltage generated by the gate power supply circuitry, between the gate terminal and the reference terminal; and
a gate leakage current detection circuitry which detects gate leakage current of the one or more semiconductor switching elements on the basis of voltage occurring between both terminals of a gate resistor which limits current for charging a gate of the one or more semiconductor switching elements, using a negative-side potential or a positive-side potential of the gate power supply circuitry as a reference,
wherein
in a configuration in which the semiconductor switching element is applied to power conversion with two or more phases, the control circuitry makes the semiconductor switching element into a zero vector state in the period in which the gate potential of the semiconductor switching element is fixed at the positive-side potential, and the control circuitry diagnoses deterioration in gate withstand voltage of the semiconductor switching element on the basis of a value of the gate leakage current detected by the gate leakage current detection circuitry.

15. The semiconductor driving device according to claim 14, wherein
in a case where a value of the gate leakage current detected by the gate leakage current detection circuitry exceeds a reference value set from characteristics of the semiconductor switching element, or a case where an increase amount of a value of the gate leakage current detected by the gate leakage current detection circuitry exceeds a reference increase amount, the control circuitry generates a deterioration determination signal, and records or displays generation of the deterioration determination signal.

16. A power conversion device comprising:
the semiconductor driving device according to claim 14; and
a power conversion circuitry composed of main semiconductor switching elements of an upper arm and a lower arm connected in series, for converting inputted power and outputting the converted power.

* * * * *